United States Patent [19]
Okudaira et al.

[11] Patent Number: 6,078,072
[45] Date of Patent: Jun. 20, 2000

[54] SEMICONDUCTOR DEVICE HAVING A CAPACITOR

[75] Inventors: Tomonori Okudaira; Yoshikazu Tsunemine; Keiichiro Kashihara, all of Hyogo, Japan

[73] Assignee: Mitsubishi Denki Kabushiki Kaisha, Tokyo, Japan

[21] Appl. No.: 09/073,834

[22] Filed: May 6, 1998

[30] Foreign Application Priority Data

Oct. 1, 1997 [JP] Japan ................................. 9-286166

[51] Int. Cl.[7] ...................... H01L 29/76; H01L 29/94; H01L 27/108; H01L 31/113
[52] U.S. Cl. .................... 257/295; 257/296; 257/306
[58] Field of Search ................. 257/295–310; 438/396–400

[56] References Cited

U.S. PATENT DOCUMENTS 5,335,138  8/1994  Sandhu et al. ..................... 257/310
5,744,832  4/1998  Wolters et al. ..................... 257/295
5,798,903  8/1998  Dhote et al. ....................... 257/295
5,853,451  12/1998 Ishikawa ............................ 75/367

FOREIGN PATENT DOCUMENTS 5-343616  12/1993  Japan .
6-65715   3/1994   Japan .
7-14993   1/1995   Japan .
9-45877   2/1997   Japan .

*Primary Examiner*—Minh Loan Tran
*Assistant Examiner*—Cuong Quang Nguyen
*Attorney, Agent, or Firm*—McDermott, Will & Emery

[57] ABSTRACT

A lower electrode layer 1 of a capacitor 10 is formed by sputtering performed at a temperature lower than 450° C. in an atmosphere containing oxygen, and thereby the lower electrode layer 1 thus formed contains oxygen. Thereby, a method of manufacturing a semiconductor device having the capacitor can suppress current leak, and can prevent peeling of an electrode.

4 Claims, 16 Drawing Sheets

SEMICONDUCTOR DEVICE HAVING A CAPACITOR

BACKGROUND OF THE INVENTION

1. Field of the Invention

The present invention relates to a semiconductor device having a capacitor and a method of manufacturing the same, and in particular to a semiconductor device having a capacitor in which a capacitor dielectric layer made of a material having a high dielectric constant is interposed between two electrodes as well as a method of manufacturing the same.

2. Description of the Background Art

Demands for semiconductor memory devices have been rapidly increased owing to rapid and wide spread of information equipments such as computers. Regarding a function, devices having a large-scale storage capacity and a high operation speed have been demanded. In view of this, technical development has been made for improving a density, a responsibility and a reliability of semiconductor memory devices.

DRAMs (Dynamic Random Access Memories) are well known as a kind of semiconductor memory devices allowing random input/output of storage information. The DRAM is formed of a memory cell array, which is a storage region storing large storage information, and a peripheral circuitry required for external input and output. The memory cell array occupies a large area on a semiconductor chip of the DRAM having the above structure. The memory cell array is provided with a plurality of memory cells each storing unit storage information and arranged in a matrix form. The memory cell is formed of one MOS (Metal Oxide Semiconductor) transistor and one capacitor connected thereto, and hence is well known as a memory cell of a one-transistor and one-capacitor type. Since the memory cell thus constructed has a simple structure, the density or degree of integration of memory cells can be increased easily, and hence is widely used in a DRAM of a large capacity.

For increasing the integration density of the DRAM, it is unavoidably required to reduce the memory size. The reduction in memory size results in reduction in planar area occupied by the capacitor. This reduces a quantity of electric charges accumulatable in the capacitor (i.e., a quantity of charges accumulatable in the memory cell of one bit) so that the DRAM may not operate stably as a storage region, resulting in lowering of a reliability.

For presenting such instability in operation of the DRAM, it is necessary to increase the capacity of the capacitor formed in a limited planar area. It has been studied to increase the dielectric constant of the capacitor dielectric layer as a measure for increasing the capacitor capacity while keeping a relatively simple form of the capacitor.

For increasing the dielectric constant of the capacitor dielectric layer, the capacitor dielectric layer may be made of a material having a high dielectric constant, i.e., a so-called high dielectric material. This high dielectric material generally has a dielectric constant which is several to hundreds of times larger than that of a silicon oxide film. By using the high dielectric material as the capacitor dielectric layer, the capacity can be easily increased while maintaining a relatively simple form of the capacitor.

Such high dielectric material may be selected from a group containing, for example, tantalum pentoxide ($Ta_2O_5$), barium strontium titanate ($Ba_xSr_{(1-x)}TiO_3$ ($0 \leq x \leq 1$), which will be simply referred to as "BST" hereinafter), lead lanthanum zirconate titanate ($Pb_xLa_{(1-x)}Zr_yTi_{(1-y)}O_3$ ($0 \leq x \leq 1$, $0 \leq y \leq 1$), which will be simply referred to as "PLZT"), strontium bismuthate tantalate ($SrBi_2Ta_2O_8$, which will be simply referred to as "SBT"), lead zirconate titanate which will be simply referred to as "PZT", strontium titanate which will be referred to as "STO", and barium titanate which will be simply referred to as "BTO".

FIG. 26 is a cross section schematically showing a structure of a semiconductor device having a capacitor in the prior art. Referring to FIG. 26, a plurality of memory cells of a DRAM is formed at regions of a silicon substrate 11 isolated from each other by an isolating and insulating layer 13. Each memory cell has a transfer gate transistor 20 and a capacitor 110, and therefore is of a one-transistor and one-capacitor type.

Each transfer gate transistor 20 has a pair of source/drain regions 15, a gate insulating layer 17 and a gate electrode layer 19. Paired source/drain regions 15 are formed at the surface of silicon substrate 11 with a space from each other. Gate electrode layer 19 is formed on a region located between paired source/drain regions 15 with gate insulating layer 17 therebetween.

A conductive layer 21 forming a bit line is connected to one of paired source/drain regions 15.

Transfer gate transistor 20 and bit line 21 are covered with an interlayer insulating film 23. Interlayer insulating film 23 is provided with contact holes 23a, each of which reaches the other of corresponding paired source/drain regions 21, and is filled with an electrically conductive plug layer 25. A capacitor 10 is electrically connected to source/drain region 15 through plug layer 25.

Each capacitor 110 has a lower electrode layer (storage node) 101, a capacitor dielectric layer 107 and an upper electrode layer (cell plate) 109. Lower electrode layer 101 is electrically connected to plug layer 25 through a barrier metal layer 103. When plug layer 25 has barrier property, barrier metal layer 103 is unnecessary. Side surfaces of lower electrode layer 101 and barrier metal layer 103 are covered with a frame insulating layer 105. When capacitor dielectric layer 107 has good coverage characteristic, frame insulating layer 105 on the side surface of lower electrode layer 101 may not be provided. Capacitor insulating layer 107 is made of a material containing the high dielectric material already described, and covers the top surface of lower electrode layer 101. Upper electrode layer 109 is opposed to lower electrode layer 101 through capacitor dielectric layer 107.

Barrier metal layer 103 serves to prevent diffusion of impurity contained in plug layer 25 into lower electrode layer 101 and improve the adhesion between lower electrode layer 101 and interlayer insulating layer 23, and is made of, e.g., TiN (titanium nitride).

All the foregoing high dielectric materials which can be used in capacitor dielectric layer 107 contain oxide of transition metal. The transition metal has such a feature that its oxidation number may take on various values. However, the oxide of a low oxidation number is generally electrically conductive. If the transition metal is to be used as capacitor dielectric layer 107, therefore, the oxide must keep a high oxidation number, and a particular attention must be given to oxygen deficit in the material and, particularly, at the vicinity of a boundary surface with respect to the electrode material.

If an easily oxidizable material such as Si (silicon) or Ti (titanium) were used, electrodes 101 and 109 would cause an oxidation-reduction reaction with respect to capacitor dielectric layer 107 so that a leak current would increase due to oxygen deficit at the vicinity of electrodes 101 and 109. Accordingly, electrodes 101 and 109 in the prior art are made of rare metal or electrically conductive oxide, which are materials having a high resistance against oxidation.

Particularly, platinum has been widely used for study and research, because the platinum has a lattice constant which is close to crystal lattice constants of PZT and BST used in capacitor dielectric layer 107, and therefore allows easy production of capacitor dielectric layer 107 having a high crystallinity owing to heteroepitaxial growth. As can be understood from the fact that the platinum may be used as catalyst, however, it is very active with respect to a surface reaction. Therefore, it increases the speed of reduction reaction of capacitor dielectric layer 107 in a reducing atmosphere, so that the insulating property of capacitor dielectric layer 107 is impaired. This fact has recently been recognized.

FIG. 27 shows leak current characteristics of a capacitor produced in such a manner that a BST film (capacitor dielectric layer) was formed on a platinum electrode formed on a silicon oxide film by sputtering at a temperature of 400° C. in an argon gas, and then a platinum electrode was formed by patterning on the BST film. The BST film had a film thickness of 60 nm and was formed under the conditions of a temperature from 400 to 600° C., a pressure from 0.2 to 0.8 Pa and a flow ratio $O_2/(Ar+O_2)$ smaller than 0.5.

Application of this film to a DRAM will now be discussed. If a power supply voltage Vcc of a DRAM is 3.3 V, a voltage of 1.65 V which is a half of Vcc is applied to a capacitor dielectric layer. As can be seen from FIG. 27, however, a leak current density of the capacitor with this voltage significantly exceeds 100 $nA/cm^2$ which is a specified request value. Although this capacitor has a simple MIM structure, it is subjected to various kinds of heat treatments in the actual DRAM process after formation of the capacitor, and is also subjected to hydrogen annealing for improving transistor characteristics. For producing a film which endures such thermal stresses and annealing in a reduction atmosphere, it is furthermore required to suppress oxygen deficit at the boundary between the electrode and the capacitor dielectric layer, and improve the crystallinity.

Japanese Patent Laying-Open No. 5-343616 (1993) has disclosed a technique for preventing occurrence of a leak current due to the oxygen deficit. According to this publication, oxygen is contained at least in a region, which is in contact with a capacitor dielectric layer, of one of electrodes of a capacitor, and thereby occurrence of a leak current due to the oxygen deficit is prevented. This publication has also disclosed manners of introducing oxygen into the electrode by ion-implanting oxygen into the electrode and by exposing the electrode to oxygen plasma. Japanese Patent Laying-Open No. 6-65715 has disclosed a manner of depositing a lower electrode layer containing oxygen introduced thereinto by sputtering in an atmosphere containing oxygen.

However, the ion implantation is a manner performed by physically introducing oxygen ions into the electrode, so that the ion implantation disturbs the crystallinity at the surface of the electrode. Also, the crystallinity of a high dielectric material, which forms the capacitor dielectric layer, is easily affected by a crystallinity of a base or underlying material. Therefore, the layer of the high dielectric material, which is formed on the surface of the electrode having a disturbed crystallinity, suffers from such problems that the crystallinity of the high dielectric material layer is disturbed, and a perovskite structure cannot be obtained, resulting in a problem that the leak current in capacitor increases.

The implantation of ions and the exposure to the oxygen plasma require additional steps, which complicates the manufacturing process.

According to Japanese Patent Laying-Open No. 6-65715, the sputtering for the lower electrode layer is performed with a substrate temperature of 500° C. or more. Therefore, the structure in which the lower electrode layer is formed on the barrier metal layer suffers from such problems that the lower electrode layer may be peeled off and that current leak may occur due to concentration of an electric field. This will now be discussed below more in detail.

FIGS. 28 to 31 are step diagrams for showing the above problems. Referring first to FIG. 28, interlayer insulating layer 23 covering transfer gate transistor 20 and others is formed, and then barrier metal layer 103 and lower electrode layer 101 are successively formed. When the substrate is set to a high temperature of 500° C. or more during the sputtering for lower electrode layer 101, barrier metal layer 103 is oxidize so that a convexity 103a is locally formed at the surface thereof.

Referring to FIG. 29, therefore, convexity 103a grown to a considerable extent is present when deposition of the lower electrode layer 101 is completed, and a stress due to convexity 103a causes cracking or the like at lower electrode layer 101.

Referring to FIG. 30, lower electrode layer 101 and barrier metal layer 103 masked with a resist pattern 151 are then patterned. Lower electrode layer 101 having cracks or the like may be locally peeled of in a step of removing resist pattern 151 after the patterning or a subsequent washing step.

Referring to FIG. 31, a convexity 101a is formed at the surface of lower electrode layer 101 due to convexity 103a formed at the surface of barrier metal layer 103. Capacitor insulating layer 107 and upper electrode 109 deposited by a sputtering method covers convexity 101a. Since the sputtering method cannot achieve a good property of covering a stepped portion, the thickness of capacitor dielectric layer 107 decreases at the vicinity (a region P) of the lower end of convexity 101a, and a peak or sharp portion 109a is formed at upper electrode 109. Since the electric field is concentrated at peak 109a, current leak is liable to occur due to this concentration and reduction in thickness of capacitor dielectric film 107.

SUMMARY OF THE INVENTION

Accordingly, an object of the invention is to provide a semiconductor device having a capacitor, which can suppress a leak current and peeling of an electrode as well as a method of manufacturing the same.

A semiconductor device having a capacitor according to the invention is a semiconductor device including a capacitor which is provided with a capacitor dielectric :layer interposed between first and second electrode layers containing a high dielectric material. In the semiconductor device, at least one of the first and second electrode layers has first and second metal layers. The second metal layer is located between the capacitor dielectric layer and the first metal layer, is in contact with the capacitor dielectric layer and contains oxygen.

In the semiconductor device having the capacitor according to the invention, the second metal layer in contact with the capacitor dielectric layer contains oxygen introduced thereinto. Therefore, oxygen is supplied from the second metal layer into the capacitor dielectric layer in a situation that oxygen deficit may occur in the capacitor dielectric layer, and the capacitor dielectric layer can maintain the insulating property. Thereby, it is possible to suppress a leak current in the capacitor.

In the structure where the electrode layer is formed on a barrier metal layer, the first metal layer not containing oxygen is present between the barrier metal layer and the second metal layer containing oxygen. Therefore, even if the sputtering for the second metal layer containing oxygen is performed at a high temperature, oxidation of the barrier metal layer is suppressed because it is covered with the first metal layer. Accordingly, it is possible to prevent peeling of the electrode layer, which may be caused by oxidation of the barrier metal layer, as well as a leak current, which may be caused by concentration of an electric field.

In the above aspect, at least one of the first and second metal layers preferably contains at least one kind of material selected from a group containing platinum, iridium, rhodium, ruthenium, palladium and osmium.

Thereby, the capacitor dielectric layer can have a high crystallinity. Also, the electrodes opposed together can be made of the same material, so that the characteristics of the electrodes can have a good symmetry.

In the above aspect, the high dielectric material preferably has at least one kind of material selected from a group containing tantalum pentoxide, barium strontium titanate, lead lanthanum zirconate titanate, strontium bismuthate tantalate, lead zirconate titanate, strontium titanate and barium titanate.

Thereby, the capacitor dielectric layer can have a high dielectric constant, and can provide a high capacitor capacity while maintaining a simple capacitor form.

In the above aspect, the semiconductor device further includes a semiconductor substrate having a main surface, a conductive region formed at the main surface, an insulating layer formed on the conductive region and having a hole reaching a portion of the conductive region, and a barrier metal layer positioned between the first electrode layer and the conductive region electrically connected through the hole. The first electrode layer has at least a portion formed on the barrier metal layer. The second electrode layer is formed on the first electrode layer with the capacitor dielectric layer therebetween. The first electrode layer has the first and second metal layers.

Thereby, it is possible to prevent peeling of the electrode layer which may be caused by oxidation of the barrier metal layer as well as leak of a current which may be caused by concentration of an electric field, even when the second metal layer containing oxygen is formed by the sputtering at a high temperature.

According to an aspect of the invention, a method of manufacturing a semiconductor device having a capacitor provided with a capacitor dielectric layer containing a high dielectric material and interposed between two electrode layers, includes the step of forming at least one of the two electrode layers by performing sputtering to deposit a metal layer at a temperature lower than 450° C. in an atmosphere containing oxygen atoms or oxygen ions.

In the method of manufacturing the semiconductor device having the capacitor according to the invention, since the sputtering for the metal layer is performed at the temperature lower than 450° C., expansion of a barrier metal layer which can be caused by oxidation is prevented. Therefore, it is possible to prevent peeling of the electrode layer due to expansion of the barrier metal, and it is also possible to prevent occurrence of a leak current.

According to another aspect of the invention, a method of manufacturing a semiconductor device having a capacitor provided with a capacitor dielectric layer containing a high dielectric material and interposed between two electrode layers, includes the step of forming at least one of the two electrode layers such that the one of the two electrode layers has a first metal layer and a second metal layer located between the capacitor dielectric layer and the first metal layer, being in contact with the capacitor dielectric layer and containing oxygen.

In the method of manufacturing the semiconductor device according of the above aspect, the first metal layer is interposed between the barrier metal layer and the second metal layer containing oxygen as a result of formation of the electrode layer on the barrier metal layer. Therefore, oxidation of the barrier metal layer is suppressed even when the second metal layer containing oxygen is formed by the sputtering at a high temperature, because the barrier metal layer is covered with the first metal layer. Accordingly, it is possible to prevent peeling of the electrode layer due to oxidation of the barrier metal, and it is also possible occurrence of a leak current due to concentration of an electric field.

In the above aspect, the metal layer preferably contains at least one kind of material selected from a group containing platinum, iridium, rhodium, ruthenium, palladium and osmium, and also contains oxygen.

Thereby, the capacitor dielectric layer can have a high crystallinity. Also, the electrodes opposed together can be made of the same material, so that the characteristics of the electrodes can have a good symmetry.

In the above aspect, the high dielectric material preferably has at least one kind of material selected from a group containing tantalum pentoxide, barium strontium titanate, lead lanthanum zirconate titanate, strontium bismuthate tantalate, lead zirconate titanate, strontium titanate and barium titanate. Thereby, the capacitor dielectric layer can have a high dielectric constant, and can provide a high capacitor capacity while maintaining a simple capacitor form.

In the above aspect, at least a part of the electrode formed by the sputtering is preferably formed on the barrier metal layer.

Thereby, it is possible to prevent peeling of the electrode layer which may be caused by oxidation of the barrier metal layer as well as leak of a current which may be caused by concentration of an electric field, even when the second metal layer containing oxygen is formed by the sputtering at a high temperature.

In the above method, the step of forming the second metal layer preferably includes the step of performing sputtering in an atmosphere containing oxygen atoms or oxygen ions. In this manner, the second metal layer containing oxygen is formed.

In the above aspect, the step of forming the second metal layer preferably has a step of forming a metal layer substantially not containing oxygen, a step of patterning the metal layer masked with a resist pattern, and performing overashing on the resist pattern with oxygen plasma to remove the resist pattern and introduce oxygen into the metal layer for completing the second metal layer. In this manner, the second metal layer containing oxygen is formed.

In the above aspect, the step of forming the second metal layer preferably has a step of ion-implanting oxygen into the metal layer. Thereby, the second metal layer containing oxygen can be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Embodiment 1

Figure 1:
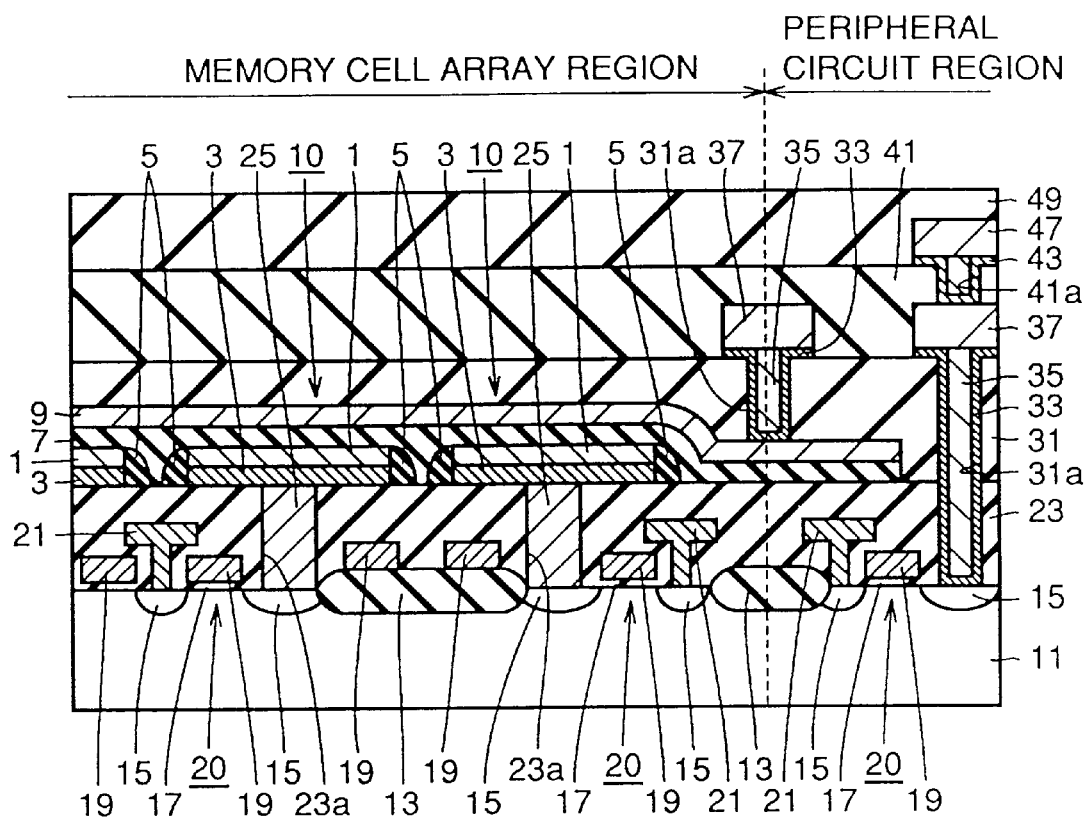
FIG. 1 is a cross section schematically showing a structure of a semiconductor device having a capacitor of an embodiment 1 of the invention.

Referring to FIG. 1, a DRAM has a memory cell array region and a peripheral circuit region. The memory cell array region includes a plurality of memory cells of the DRAM, which are located at regions on a silicon substrate 11 isolated from each other by an isolating and insulating layer 21. Each memory cell has a transfer gate transistor 20 and a capacitor 10, and thus is of a one-transistor and one-capacitor type.

Each transfer gate transistor 20 has a pair of source/drain regions 15, a gate insulating layer 17 and a gate electrode layer 19. Paired source/drain regions 15 are formed at the surface of silicon substrate 11 with a space between each other. Gate electrode layer 19 is formed on a region between paired source/drain regions 15 with gate insulating layer 17 therebetween.

A conductive layer 21 forming a bit line is electrically connected to one of paired source/drain regions 15.

In the peripheral circuit region, circuits are formed for external input/output and others. The circuits have, for example, MOS transistors 20. Each MOS transistor 20 has a structure similar to that of transfer gate transistor 20 in the memory cell array region. Conductive layer 21 forming an interconnection layer is electrically connected to one of source/drain regions 15 of MOS transistor 20.

An interlayer insulating layer 23 covering these transistors 20 and conductive layers 21 is formed over the entire surface of the structure. Interlayer insulating layer 23 is provided with contact holes 23a reaching source/drain regions of transfer gate transistors 20, respectively. Each contact hole 23a is filled with a plug layer 25 which is made of, e.g., polycrystalline silicon doped with impurity (which will be referred to as "doped polycrystalline silicon" hereinafter). Capacitors 10 are electrically connected to source/drain regions 15 through plug layers 25, respectively.

Each capacitor 10 has a lower electrode layer 1, a capacitor dielectric layer 7 and an upper electrode layer 9. Lower electrode layer 1 is formed on interlayer insulating layer 23, is electrically connected to plug layer 25 through a barrier metal layer 3, and is made of, e.g., Pt (platinum). Barrier metal layer 3 is made of, e.g., TiN/Ti (titanium nitride/titanium). Side surfaces of barrier metal layer 3 and lower electrode layer 1 are covered with a frame insulating layer 5 made of, e.g., a silicon oxide film. Capacitor insulating layer 7 covers lower electrode layer 1, and is made of, e.g., a material having a high dielectric constant such as BST described before. Upper electrode layer 9 is opposed to lower electrode layer 1 with capacitor dielectric layer 7 therebetween, and is made of, e.g., Pt.

At least one of lower and upper electrode layers 1 and 9 contains oxygen which is uniformly introduced thereinto at an oxygen concentration from 0.01 wt % (% by weight) to 5 wt %.

If the oxygen content is lower than 0.01 wt %, introduction of oxygen can achieve only an excessively small effect so that oxidation/reduction reactions occur at the boundary of capacitor dielectric layer 7 with respect to electrodes 1 and 9, and thereby the high dielectric material of capacitor dielectric layer 7 is reduced, resulting in increase in leak current. If the oxygen content exceeds 5 wt %, a leak current increases due to the following reasons (1) to (3) when forming capacitor dielectric layer 7 by sputtering in an oxygen atmosphere.

(1) Capacitor insulating layer 7 cannot sufficiently cover convexities and concavities which are formed due to expansion of barrier metal layer 3, resulting in increase in leak current.

(2) Convexities and concavities which are formed due to expansion of barrier metal layer 3 cause concentration of an electric field, resulting in increase in leak current.

(3) Formation of capacitor dielectric layer 7 and a subsequent heat treatment change a structure underlying capacitor dielectric layer 7, so that capacitor dielectric layer 7 is subjected to a stress or is cracked, resulting in increase in leak current.

Capacitors 10 are covered with an interlayer insulating layer 31. Interlayer insulating layer 31 is provided with a contact hole 31a reaching upper electrode layer 9, and is also provided with a contact hole 31a reaching source/drain region 15 at the peripheral circuit region. Each contact hole 31a is filled with a plug layer 35 made of, e.g., tungsten with a multilayer film 33 of TiN/Ti therebetween. An aluminum interconnection layer 37 is electrically connected to each plug layer 35.

Aluminum interconnection layers 37 are covered with an interlayer insulating layer 41, which is provided with a contact hole 41a reaching aluminum interconnection layer 37. Contact hole 41a is filled with a plug layer 45 made of, e.g., tungsten with a multilayer film 43 of TiN/Ti therebetween. An aluminum interconnection layer 47 is electrically connected to plug layer 45. A plasma nitride film 49 covering aluminum interconnection layer 47 is formed over the entire surface of the structure.

A manufacturing method of the embodiment will be described below.

Figure 2:
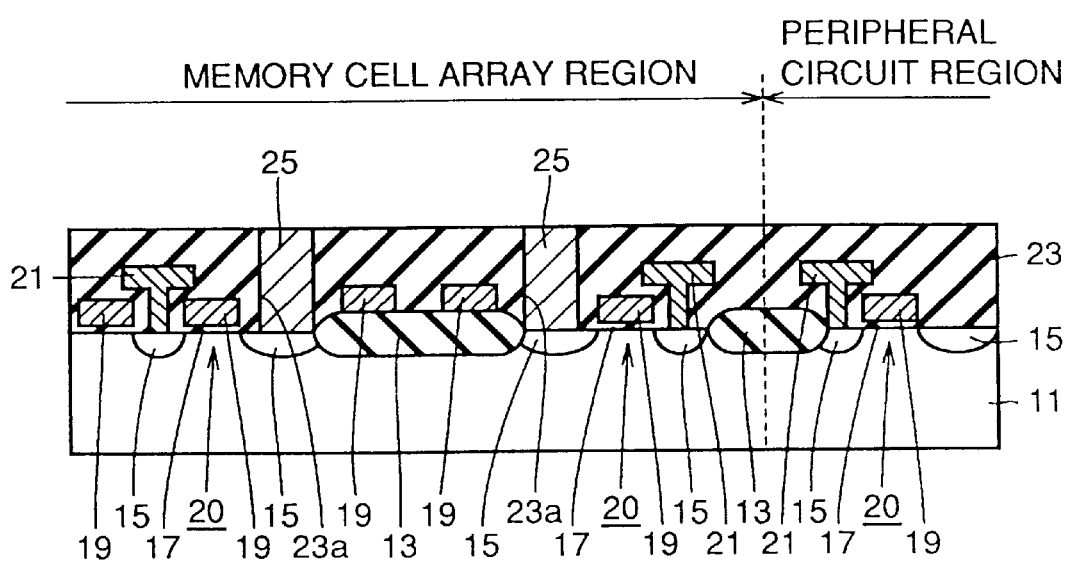
FIGS. 2 to 9 are schematic cross sections showing, in accordance with the order of steps, a method of manufacturing the semiconductor device having the capacitor of the embodiment 1 of the invention.

Referring first to FIG. 2, interlayer insulating layer 13 is formed on silicon substrate 11. Transistors 20 are formed at regions thus isolated, and subsequent processing is performed to form conductive layers 21 in contact with the source/drain regions 15 of the transistors 20, respectively. Processing is performed to form interlayer insulating layer 23 covering transistors 20 and conductive layers 21, and contact holes 23a each reaching source/drain region 15 of corresponding transfer gate transistor 20 are formed at interlayer insulating layer 23. Processing is performed to form plug layers 25 made of doped polycrystalline silicon and filling contact holes 23a, respectively.

Figure 3:
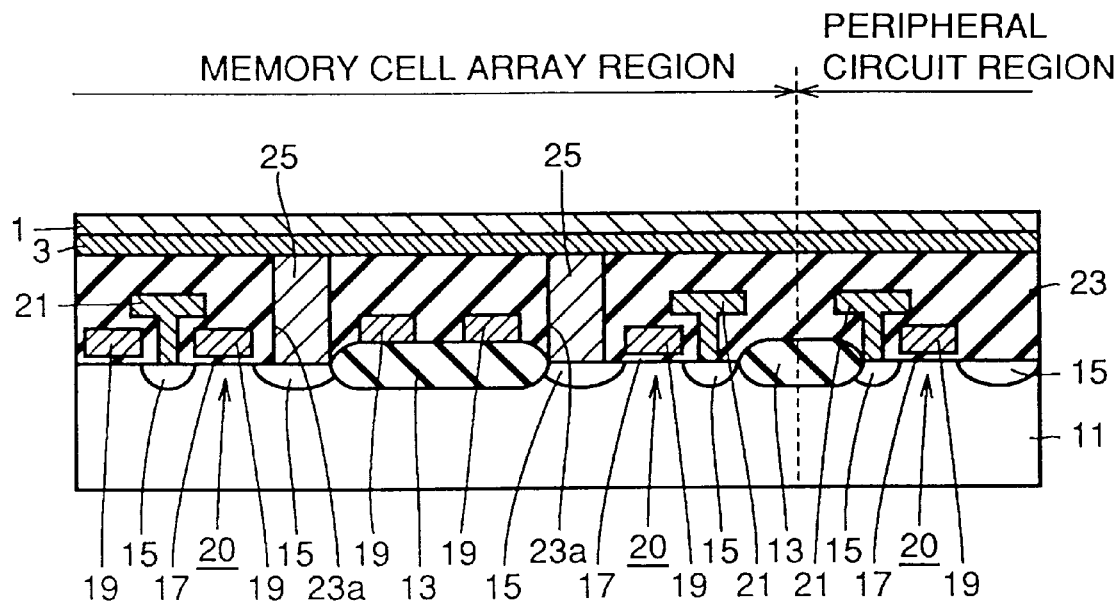

Referring to FIG. 3, a DC sputtering method targeted at Ti is performed to form TiN/Ti multilayer film 3 serving as an anti-diffusion layer and having a thickness from 20 to 100 nm on the entire surface. Subsequently, an RF magnetron sputtering method targeted at platinum is performed to form a platinum film 1 having a thickness from 30 to 100 nm under the conditions of a wafer heating temperature lower than 450° C., a pressure from 0.1 to 1.2 Pa, a flow ratio of $O_2/(Ar+O_2)$ in a range from $1\times10^{-5}$ to 0.1 and an output of 1 kW. Sputtering power in the platinum film forming condition is not limited to 1 kW and it may be in a range of 0.3 to 10 kW. Owing to the above conditions for forming platinum film 1, oxygen is introduced uniformly and entirely into platinum film 1 at a density from 0.01 wt % to 5 wt %. Although the RF magnetron sputtering is employed for forming platinum film 1, another sputtering method such as a DC sputtering may be employed. Also, the film thickness is not particularly restricted to the above value.

Figure 4:
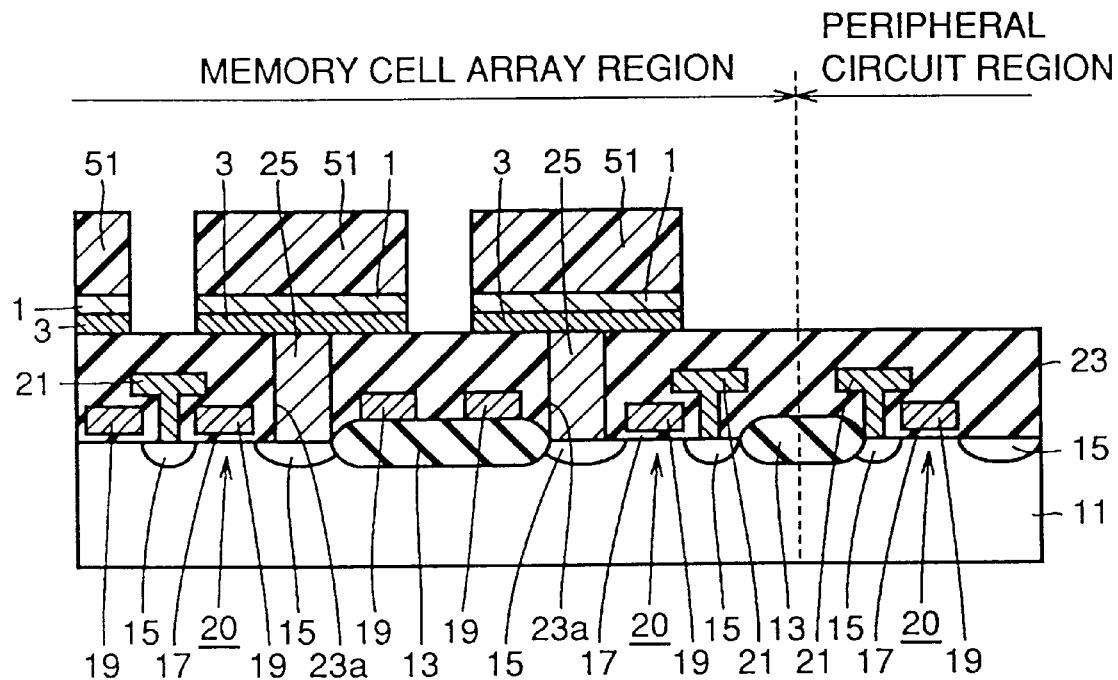

Referring to FIG. 4, a resist pattern 51 is formed on platinum film 1 by an ordinary photolithography technique. Platinum film 1 and TiN/Ti multilayer film 3 masked with resist pattern 51 are successively patterned to form lower electrode layer 1 and barrier metal layer 3. Then, resist pattern 51 is removed by ashing.

Figure 5:
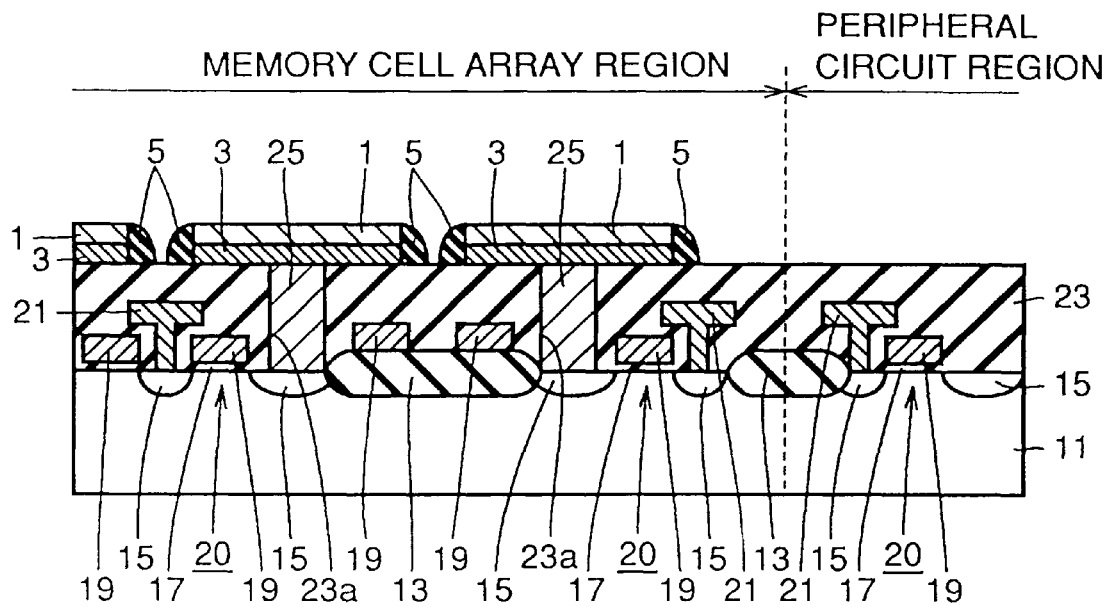

Referring to FIG. 5, a silicon oxide film from 50 to 400 nm in thickness is formed on the whole surface, and then is subjected to anisotropic etching, so that frame insulating film 5 is formed on the side surfaces of lower electrode layer 1 and barrier metal layer 3.

The purpose of provision of frame insulating film 5 is to prevent insulation breakage, which may be caused in a later step of forming the capacitor dielectric layer by the sputtering method if the capacitor dielectric layer cannot sufficiently cover the side surface of the lower electrode. Therefore, frame insulating film 5 may be eliminated if the capacitor dielectric layer is formed by the CVD (Chemical Vapor Deposition) method or by the deposition which is performed several times. If the side surface of lower electrode layer 1 is also to be used as the capacitor, a side wall conductive film (not shown) may be arranged on the side surface of lower electrode layer 1.

Figure 6:
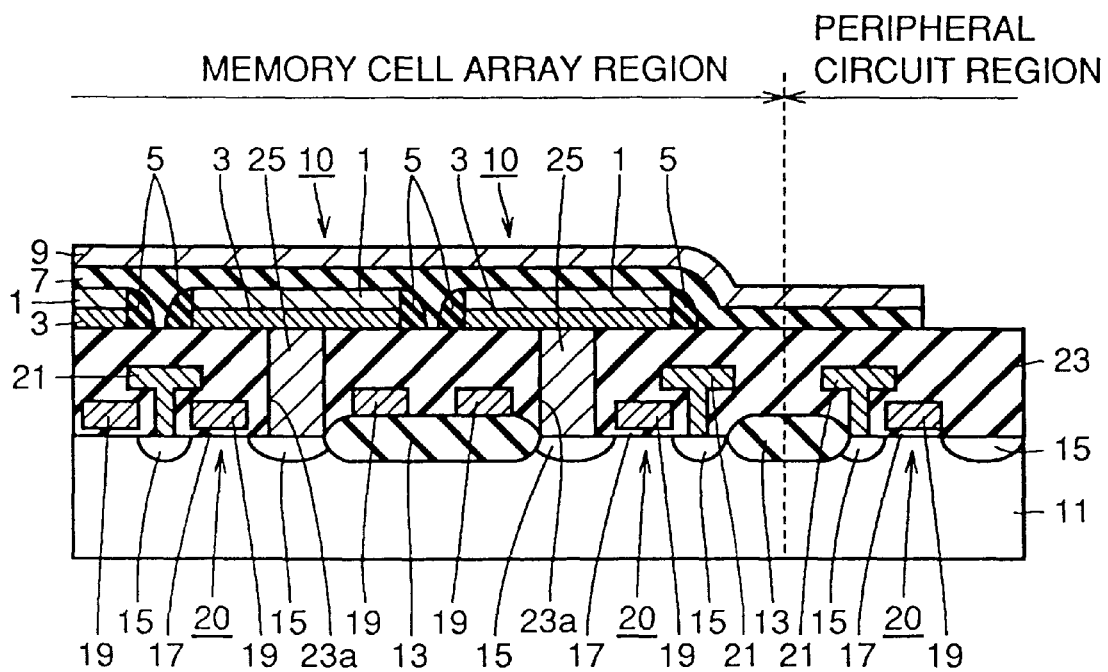

Referring to FIG. 6, processing is performed to form capacitor dielectric layer 7 made of the BST film and having a thickness of 150 to 600 Å on the entire surface under the conditions of 400–600° C., 600–800 W, 0.4 Pa and $O_2/(Ar+O_2) \leq 0.5$. The BST film forming condition is not limited thereto. Then, upper electrode layer 9 made of, e.g., platinum and having a thickness from 30 to 100 nm is formed on capacitor dielectric layer 7 by the RF magnetron sputtering method targeted at platinum under the conditions of 200–600° C., 0.1–1.2 Pa, $O_2/(Ar+O_2)$ in a range from $1\times10^{-5}$ to 0.1 and 1 kW. Sputtering power in the platinum film forming condition is not limited to 1 kW and it may be in a range of 0.3 to 10 kW. Then, upper electrode layer 9 and capacitor dielectric layer 7 are successively patterned by the ordinary photolithography and etching techniques.

Although BST film 7 is formed by performing the deposition one time in accordance with the sputtering method, the CVD method may be employed or the deposition may be performed several times for forming the same. Upper electrode layer 9 is formed in the sputtering method under the above conditions so that oxygen is introduced uniformly and entirely into upper electrode layer 9 at a concentration from 0.01 wt % to 5 wt %.

Figure 7:
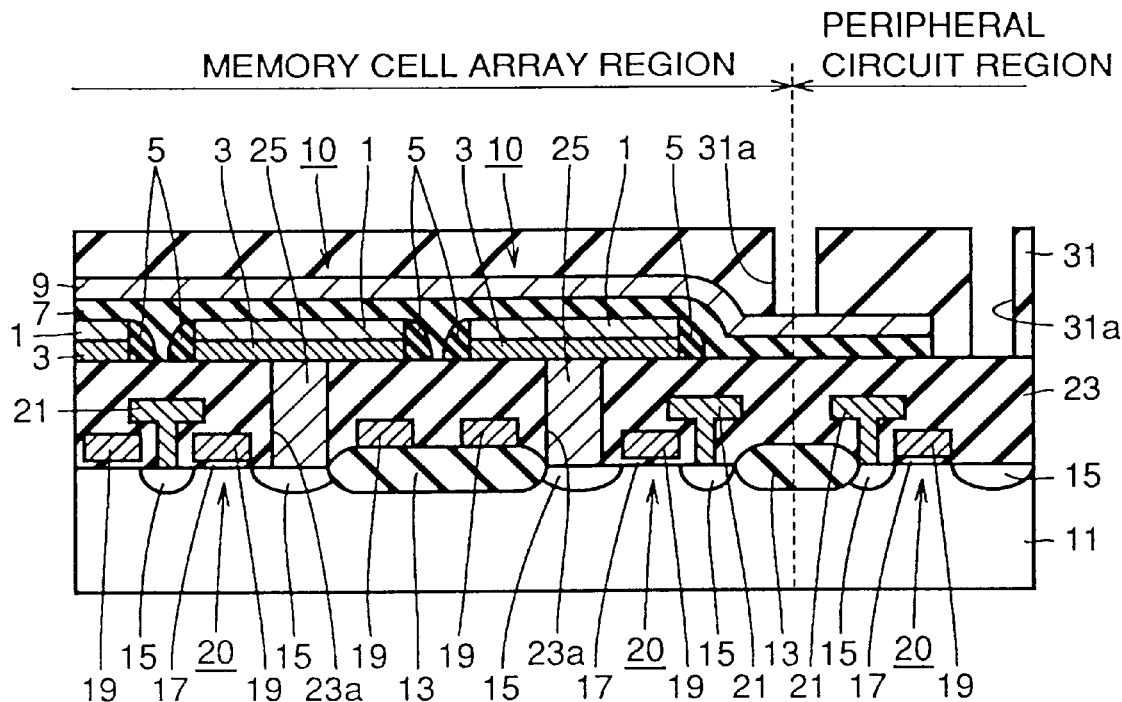

Referring to FIG. 7, film 31 such as a normal pressure plasma oxide film of 100–400 nm in thickness is formed as the interlayer insulating film above the capacitor. Processing in accordance with the ordinary photolithography and etching techniques is effected on interlayer insulating film 31 to form contact holes 31a each reaching upper electrode layer 9 or a predetermined position on the peripheral circuit region.

In FIG. 7, contact hole 31a is opened directly on silicon substrate 11 in the peripheral circuit region. Alternatively, a pad made of doped polycrystalline silicon or another conductive material may be formed in contact with silicon substrate 11, and contact hole 31a may be opened on the pad.

Figure 8:
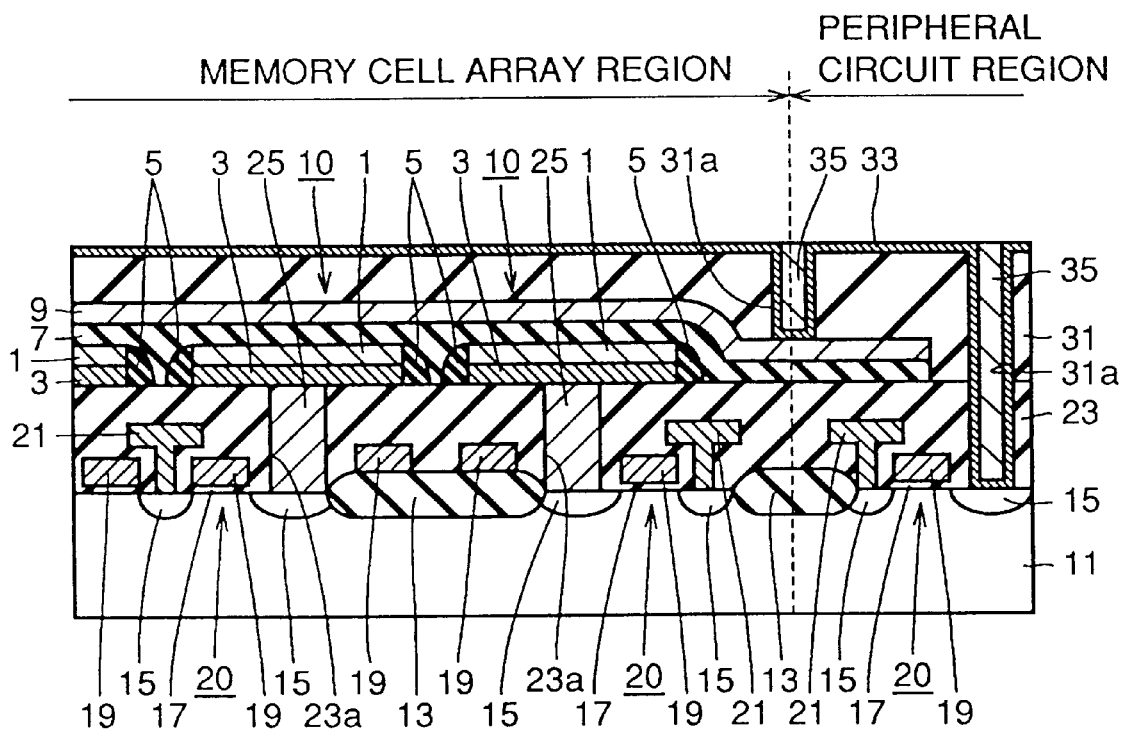

Referring to FIG. 8, the DC sputtering method targeted at Ti is performed to form the anti-diffusion layer, i.e., TiN/Ti layer 33 of 20–100 nm in thickness entirely covering the inner surface of each contact hole 31a. Then, processing, for example, by the CVD method is performed to form tungsten film 35 which covers the entire surface and fills contact holes 31a. Then, etchback is effected on tungsten film 35 to leave only portions of tungsten film 35 filling contact holes 31a.

The purpose of filling contact holes 31a with plug layers 35 is to prevent breakage of the aluminum interconnection layer, which will be formed by the sputtering method in a later step, due to insufficient coverage in contact hole 31a. Therefore, plug layer 35 is not particularly necessary if the aluminum interconnection layer is formed by the CVD method, or by employing reflow aluminum or a force-fill method, in which aluminum is supplied into the contact hole by a high pressure.

Figure 9:
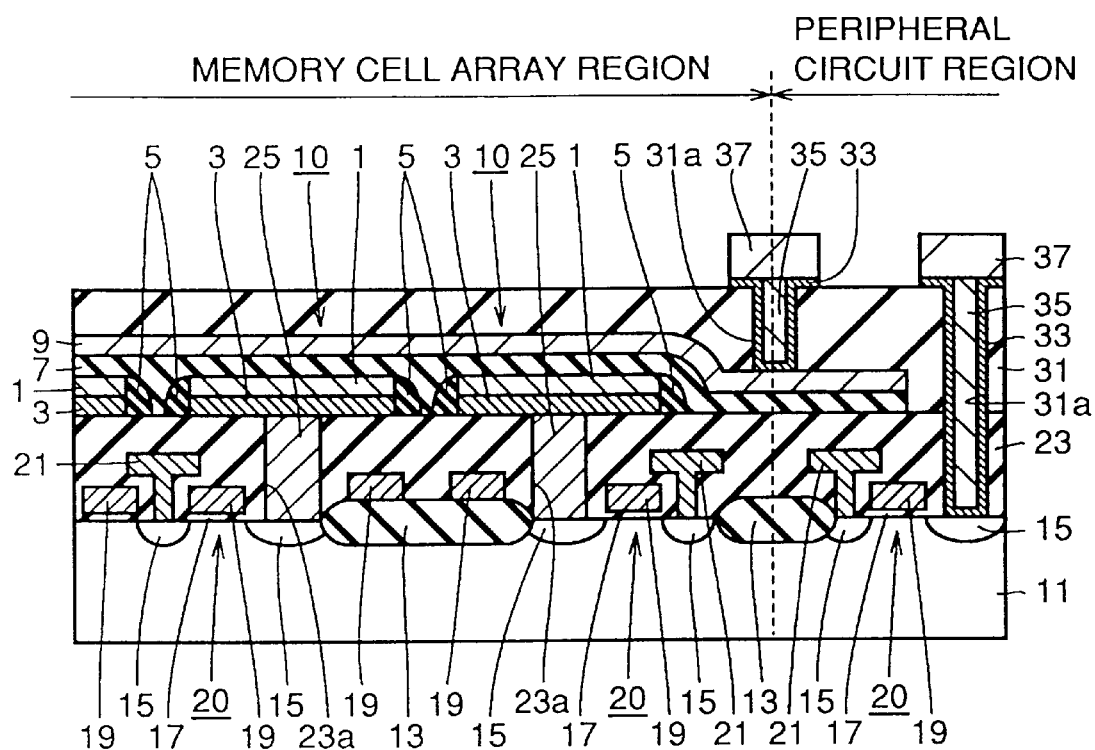

Referring to FIG. 9, aluminum film 37 of 300–1000 nm in thickness is formed by the DC sputtering method targeted at aluminum (Al). Subsequently, aluminum film 37 is patterned into a predetermined configuration to form the interconnection layer by the ordinary photolithography and etching techniques.

Thereafter, steps similar to those shown in FIGS. 8 and 9 are repeated to form interlayer insulating layer 41, anti-diffusion layer 43, plug layer 45 and aluminum interconnection layer 47, and then plasma nitride film 49 is formed so that the structure of the DRAM shown in FIG. 1 is completed.

In this embodiment, since lower and upper electrode layers 1 and 9 in FIG. 1 contain oxygen, oxygen is supplied into capacitor dielectric layer 7 from platinum in electrodes 1 and 9 in such a situation that oxygen deficit may occur in capacitor dielectric layer 7. Therefore, capacitor dielectric layer 7 can maintain the insulating property. Since oxygen is sufficiently supplied in the initial stage of formation of capacitor dielectric layer 7, it is possible to produce capacitor dielectric layer 7 having a good crystallinity.

Figure 10:
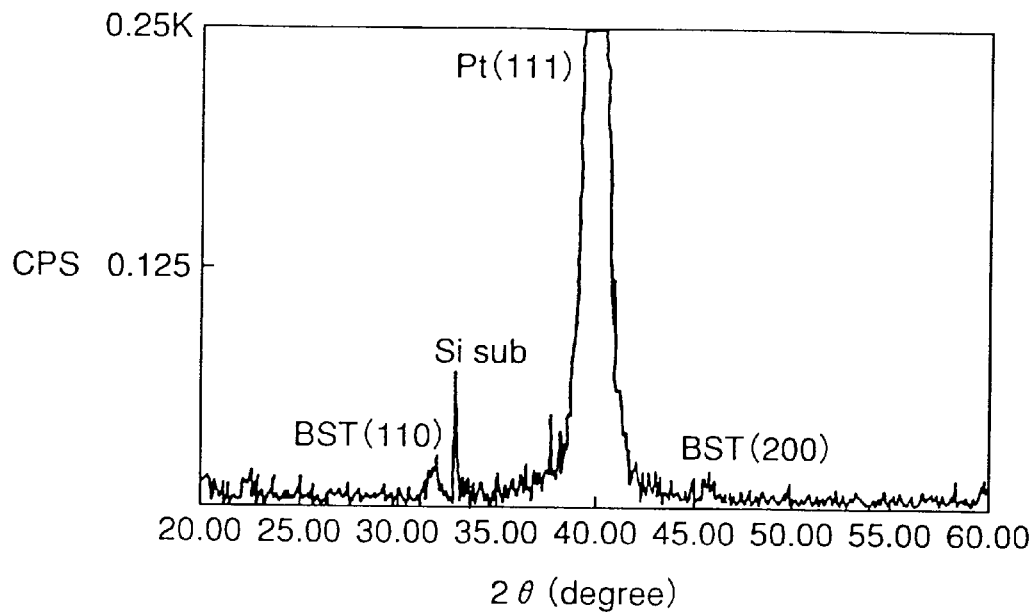
FIG. 10 shows an X-ray diffraction pattern of a thin BST film in the prior art formed on a platinum film not containing oxygen introduced thereinto.
Figure 11:
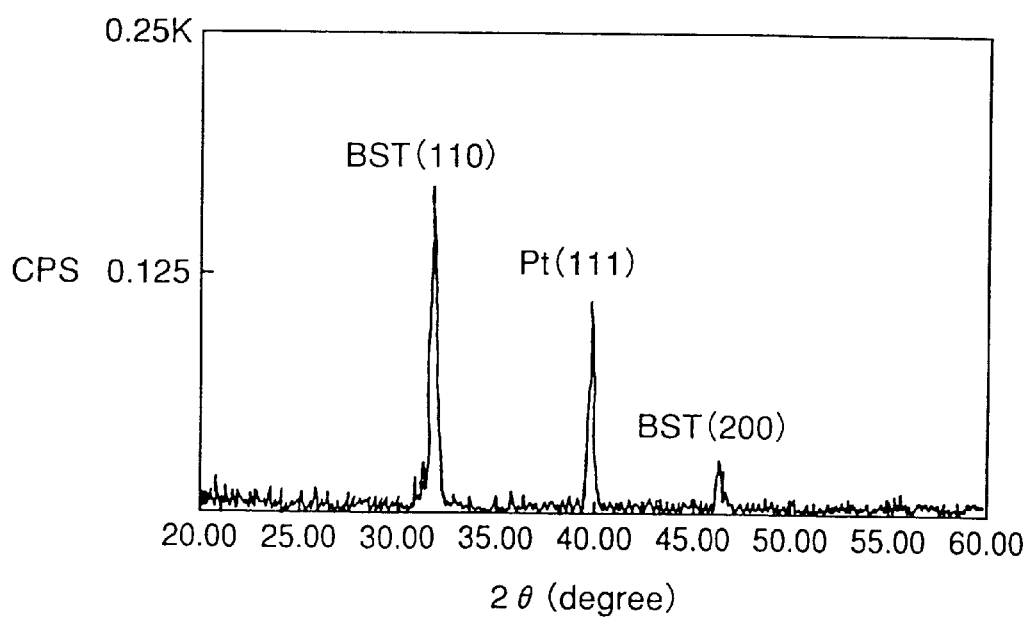
FIG. 11 shows an X-ray diffraction pattern of a thin BST film formed on a platinum film formed by the method of the embodiment 1 of the invention.

FIGS. 10 and 11 show X-ray diffraction patterns of BST films which were formed on platinum films in an atmosphere of 100% argon and an atmosphere of oxygen, respectively. Referring to FIGS. 10 and 11, the platinum film containing oxygen added thereinto was formed under the conditions of 350–450° C., 1 kW, 0.2–1.2 Pa and $O_2/(Ar+O_2) \leq 0.05$, and the BST film was formed under the conditions of 400–600° C., 600–800 W, 0.4 Pa and $O_2/(Ar+O_2) \leq 0.5$.

From these results, it can be understood that the VST film formed on the platinum film containing oxygen added thereinto has a higher crystallinity than the BST film formed on the platinum film not containing oxygen, and thus has an improved crystallinity.

Regarding the conditions of the sputtering with oxygen for addition, the optimum value of the flow ratio of $Ar/O_2$ in the atmosphere gas changes with the deposition temperature of platinum. If the deposition were performed at a low temperature, an oxygen content would excessively increase, resulting in coarse surface homology. If the partial pressure of oxygen with respect to argon is 20 ppm or more, addition of oxygen can achieve an intended effect.

Figure 12:
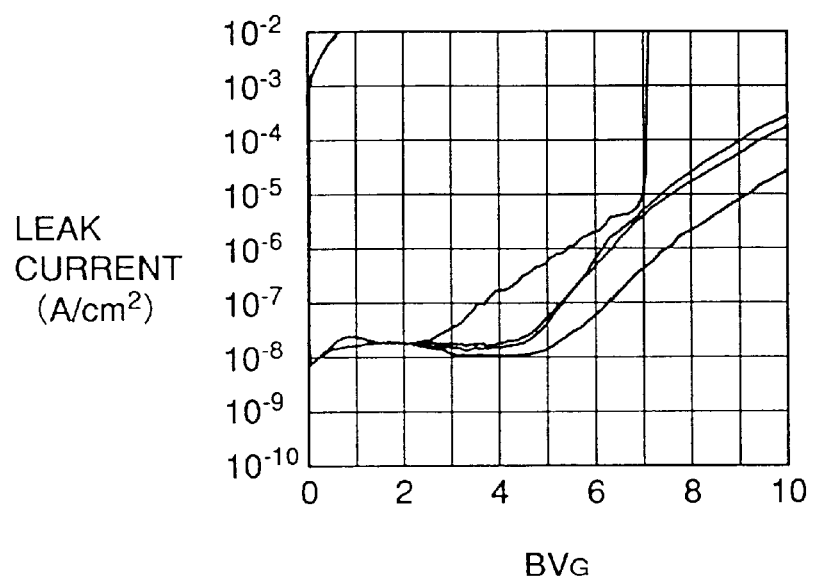
FIG. 12 is a graph showing a relationship between $BV_G$ and a leak current of the capacitor manufactured by the method of the embodiment 1 of the invention.
Figure 27:
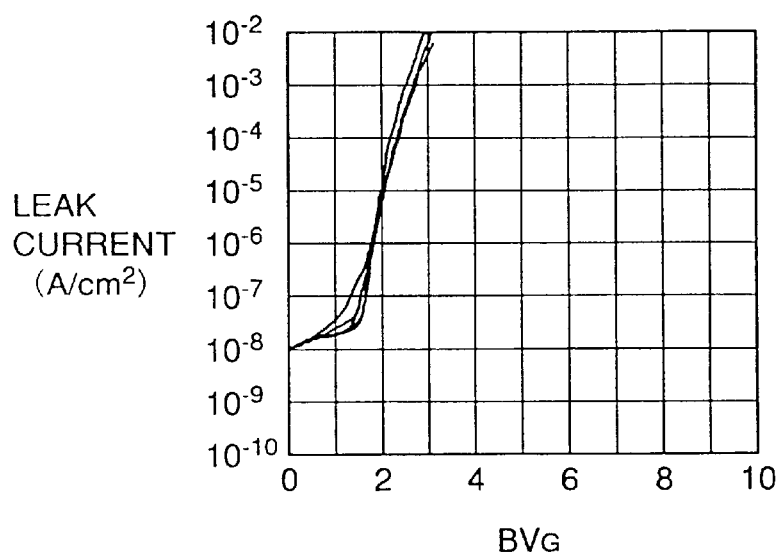
FIG. 27 is a graph showing a relationship between $BV_G$ and a leak current of the semiconductor device having the capacitor in the prior art.
Figure 28:
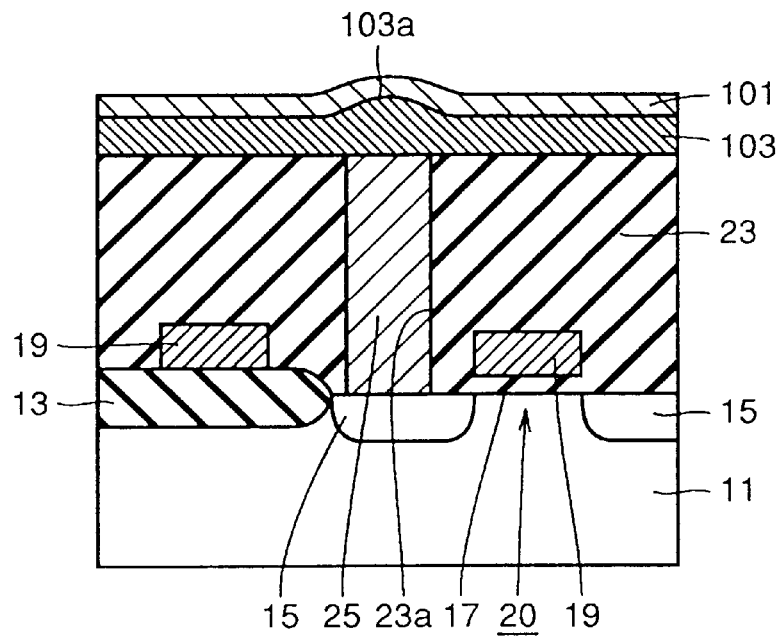
FIGS. 28 to 31 are step diagrams for showing the fact that a problem arises in a method of forming an electrode in the prior art.
Figure 29:
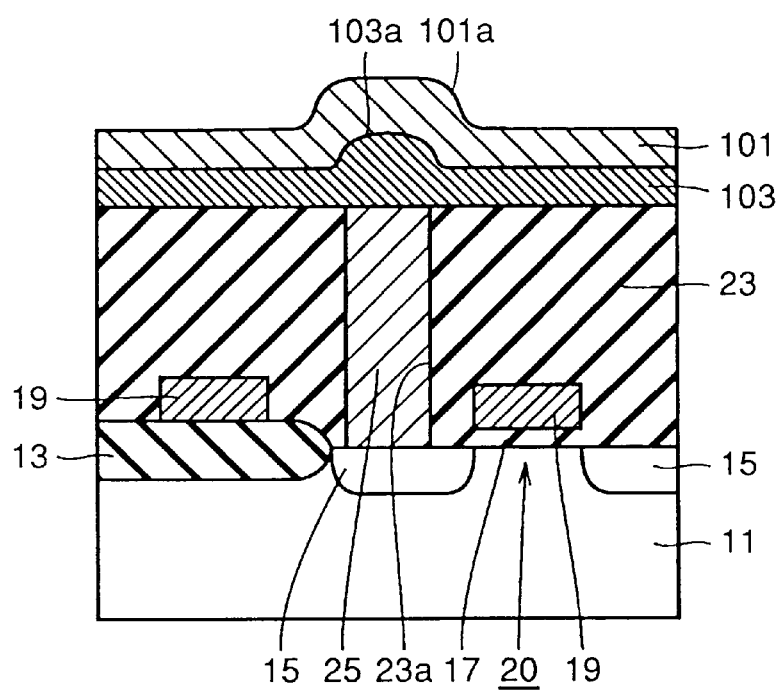
Figure 30:
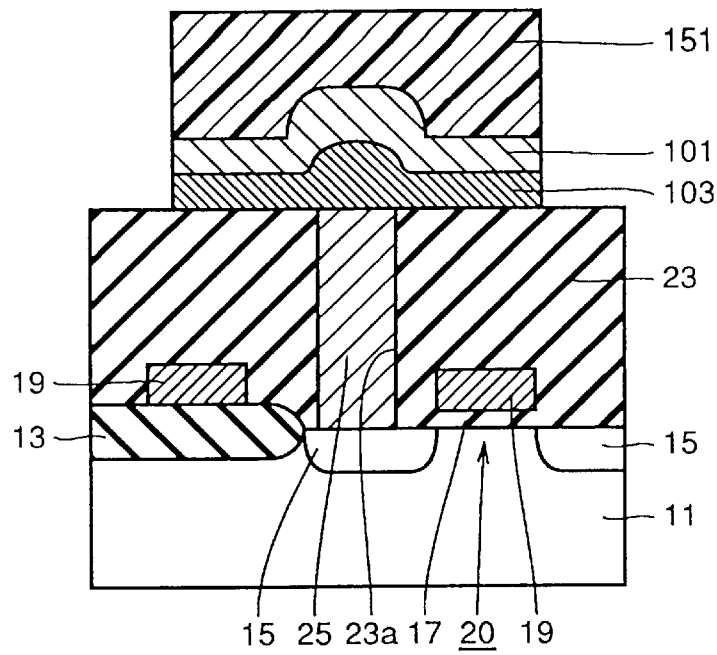
Figure 31:
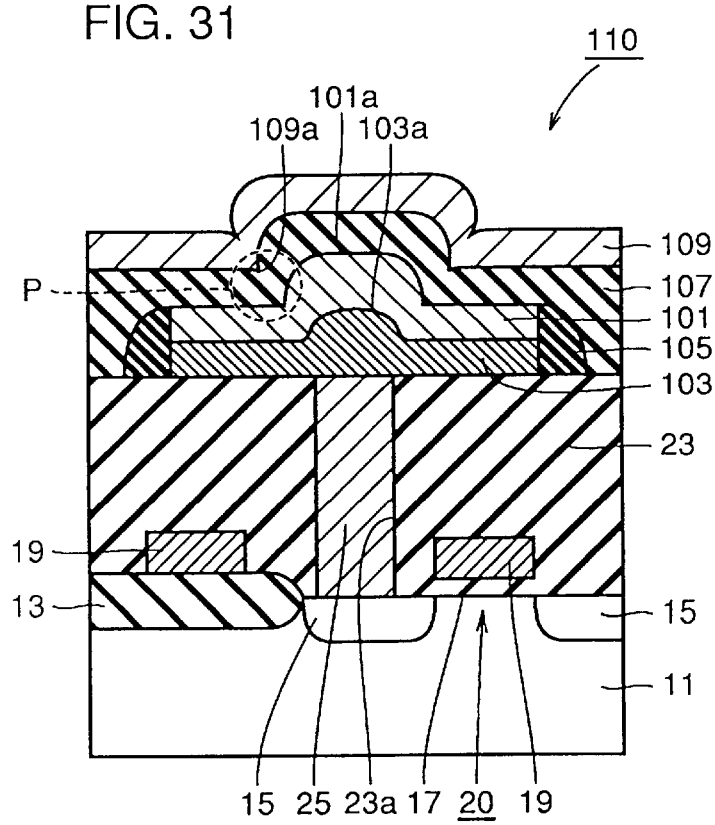

FIG. 12 shows leak current characteristics of the capacitor employing the platinum film containing oxygen. The film thickness of the BST film, the deposition temperature and the manner of forming the upper electrode are the same as those in the prior art already described with reference to FIG. 27. From comparison of the characteristics in FIG. 12 with those in FIG. 27 obtained by sputtering with only argon, it can be understood that the sputtering in the atmosphere of Ar containing $O_2$ added thereinto significantly improved the leak current characteristics of the capacitor.

Figure 13:
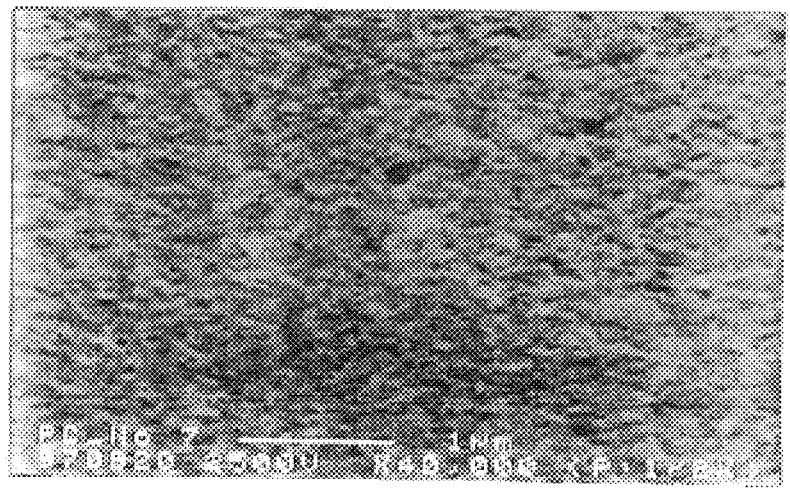
FIG. 13 is an SEM photograph showing an upper surface of a platinum film formed at a sputtering temperature in the embodiment of the invention.
Figure 14:
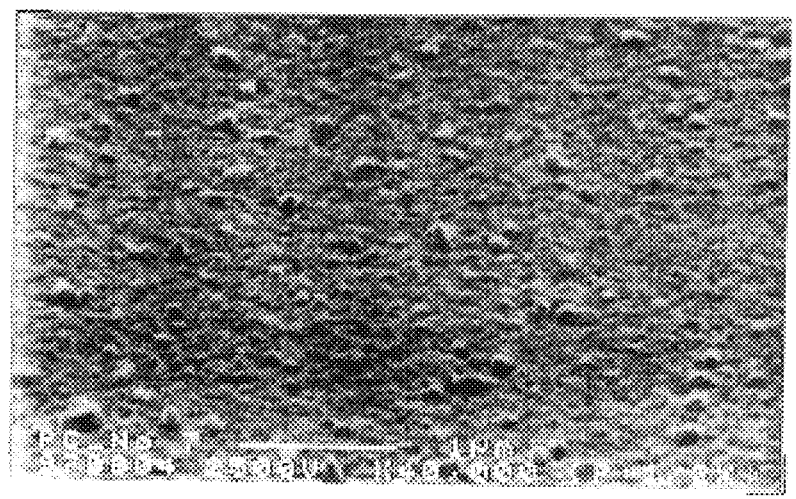
FIG. 14 is an SEM photograph showing an upper surface of a platinum film formed at a sputtering temperature in the prior art.

An experiment was performed for determining coarsening of the surface of the lower electrode layer which was made of platinum and was formed on the barrier metal layer of TiN. FIG. 13 is an SEM image of the surface of the platinum layer which was formed on the barrier metal layer of TiN under the conditions of the wafer heating temperature of 250° C., the flow ratio of $Ar/O_2$ equal to 40/0.15, the pressure of 0.19 Pa and 1 kW. FIG. 14 is an SEM image of the surface of the platinum layer which was formed on the barrier metal layer of TiN under the conditions of the wafer heating temperature of 450° C., the flow ratio of $Ar/O_2$ equal to 38/2, the pressure of 0.19 Pa and 1 kW.

As can be seen from FIGS. 13 and 14, expansion did not occur at the surface of the platinum film when the platinum film was formed by the sputtering at a relatively low wafer heating temperature of 250° C., but expansion occurred at the surface of the platinum film when the platinum film was formed by the sputtering at a relatively high wafer heating temperature of 450° C. Also, it can be found that expansion did not occur at the platinum surface if the wafer heating temperature during the platinum sputtering of platinum was lower than 450° C.

Expansion at the surface of the platinum film was caused by the fact that the barrier metal underlying the platinum film was oxidized during sputtering for the platinum film.

According to this embodiment, since the platinum film is formed by the sputtering at the wafer heating temperature lower than 450° C., expansion of the barrier metal layer during the sputtering is prevented so that it is possible to prevent peeling of the platinum film, which may be caused by this expansion, as well as occurrence of current leak due to concentration of an electric field.

In this embodiment, since oxygen can be introduced into lower electrode layer 1 simultaneously with the sputtering for lower electrode layer 1, an independent process for introducing oxygen into lower electrode layer 1 is not required. This prevents complication of the processes.

Since introduction of oxygen is performed simultaneously with the sputtering for lower electrode layer 1, it is possible to prevent disturbance of the crystallinity of lower electrode layer 1, which may occur when introducing oxygen by ion implantation. Accordingly, it is possible to prevent disturbance of the crystallinity of capacitor dielectric layer 7 formed on lower electrode layer 1, and therefore occurrence of current leak can be prevented.

Embodiment 2

In a conventional device structure, barrier metal layer 3 is present between platinum film 1 and the silicon substrate (or conductive layer 25 made of, e.g., doped polycrystalline silicon) for preventing mutual diffusion, as shown in FIG. 1. When the sputtering is performed for forming platinum film 1 in an atmosphere of $Ar/O_2$, underlying barrier metal layer 3 may be oxidized with oxygen and thereby may cause a failure in contact. This oxidation of the underlying layer can be effectively suppressed by such a manner that the sputtering for platinum film 1 is performed in the argon and subsequently oxygen is added into platinum film 1 by the oxygen plasma.

This manner offers an advantage that the heating temperature during sputtering and the temperature during addition of oxygen can be controlled independently of each other in contrast to the reactive sputtering method of the embodiment 1. If the platinum film were formed at a low temperature, it would be crystallized to an excessively higher extent, for example, due to a heat during formation of the BST layer (capacitor dielectric layer) in a later step, and thereby the surface would roughen due to grain growth in some cases. Therefore, the platinum film must be formed at a temperature (200° C. or higher) which is increased to a certain extent. Meanwhile, it is preferable to perform the addition of oxygen at a low temperature in view of oxidation of the underlying layer. In this embodiment, ashing with oxygen plasma is performed in the step of removing the resist after patterning the lower electrode layer, and this ashing is performed for a time longer than the optimum time for removing the resist (i.e., overashing is performed), whereby the removal of resist and oxygen plasma processing for the platinum electrode are performed continuously. A manufacturing method of the embodiment will be described below.

The manufacturing method of this embodiment is executed through steps similar to those of the embodiment 1 shown in FIGS. 2 to 4. However, there is a difference that the sputtering of platinum shown in FIG. 3 is performed in an atmosphere of 100% argon. More specifically, the platinum film of 30–100 nm in thickness is formed by the RF magnetron sputtering method targeted at platinum under the conditions of 200–600° C., Ar 0.1–1.2 Pa, and 1 kW. Sputtering power in the platinum film forming condition is not limited to 1 kW and it may be in a range of 0.3 to 10 kW. In this embodiment, platinum film 1 is produced by the RF magnetron sputtering, another sputtering method such as DC sputtering may be employed. Also, the film thickness is not particularly restricted to the above value. Since the sputtering for forming platinum film 1 is performed in the atmosphere which does not contain oxygen, platinum film 1 thus formed does not yet contain oxygen.

Figure 15:
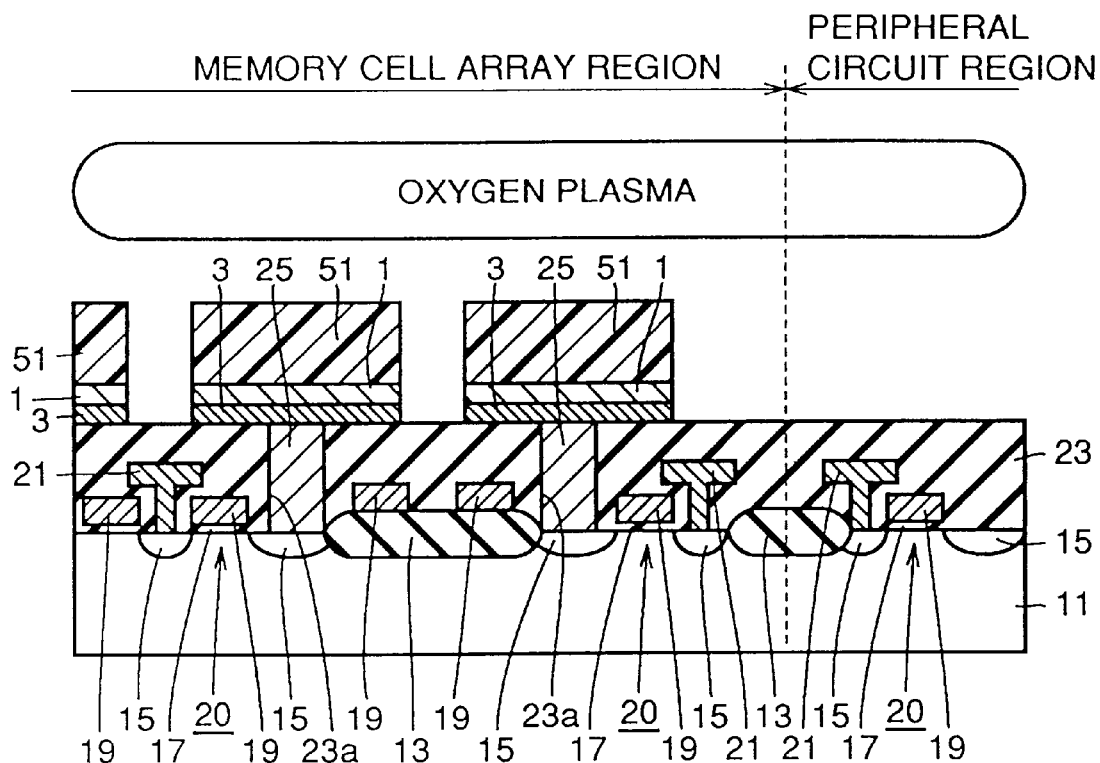
FIGS. 15 to 17 are schematic cross sections showing, in accordance with the order of steps, a method of manufacturing the semiconductor device having the capacitor of an embodiment 2 of the invention.

Referring to FIG. 15, after formation of the lower electrode by patterning platinum film 1, resist pattern 51 is removed with oxygen plasma and more specifically is removed by, for example, exposure to the oxygen plasma for 1–2 minutes under the conditions of the pressure of $O_2$ equal to 1 Torr and 800 W. Thereafter, exposure to the oxygen plasma is further performed (i.e., overashing is performed) so that a region 1a containing oxygen introduced thereinto is formed at the upper surface of lower electrode layer 1 as shown in FIG. 16.

Figure 17:
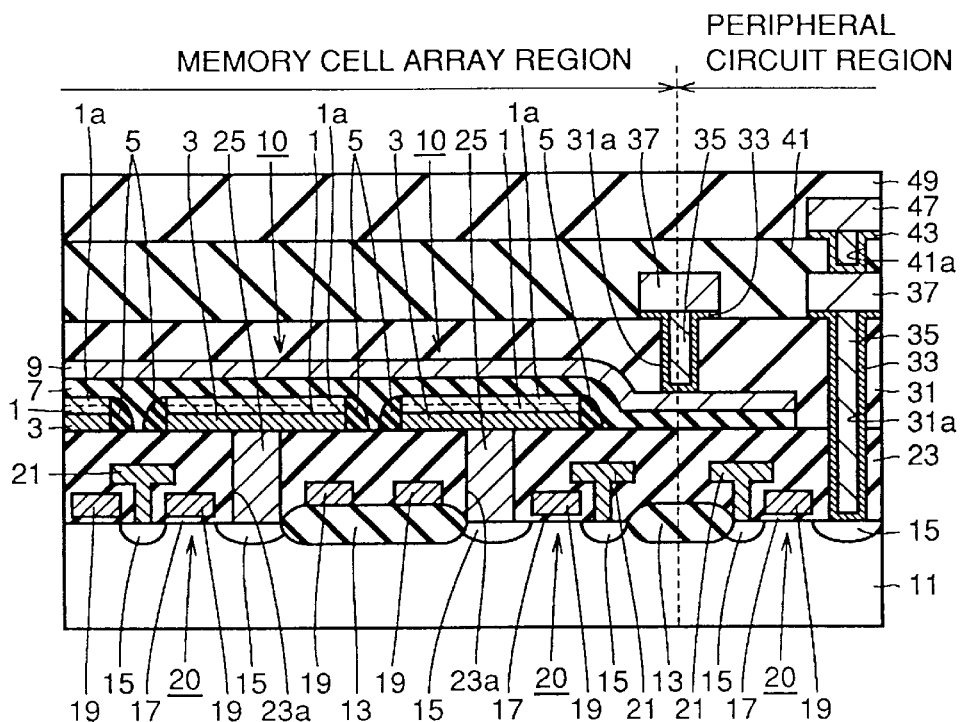

Thereafter, steps similar to those of the embodiment 1 shown in FIGS. 5 to 9 are performed so that a structure of the DRAM shown in FIG. 17 is completed.

Figure 16:
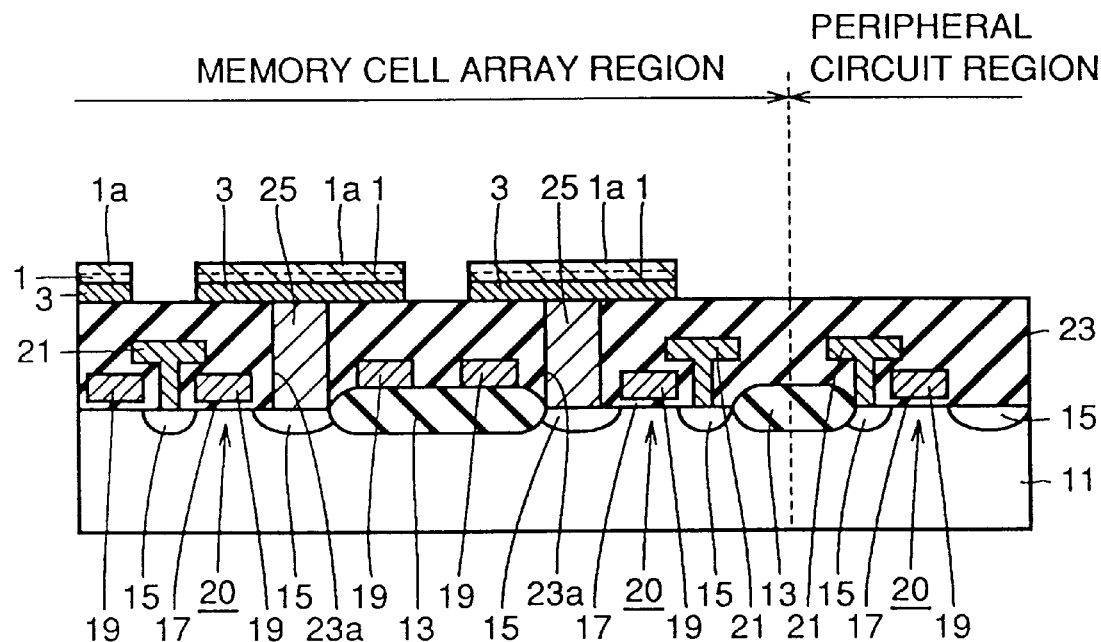

The steps for ashing shown in FIGS. 15 and 16 will be further discussed particularly with respect to an appropriate amount or degree of overashing enabling intended introduction of oxygen into the upper electrode.

For removing the resist pattern, overashing of 100–150% is usually performed. Particularly, an ashing device of a sheet type generally takes 2–5 minutes in total for overashing of 100–150%.

The inventors and others determined the relation between the time of $O_2$ plasma processing, which was effected on the platinum film formed on the barrier metal layer made of TiN, and characteristics teq of the BST film deposited on the platinum film. The result is shown in the following Table 1.

TABLE 1

| Time of $O_2$ Plasma Processing (Min.) | teq (nm) |
|---|---|
| 0 | 0.515 |
| 3 | 0.505 |
| 10 | 0.473 |
| 30 | 0.480 |

The characteristics teq represent the film thickness of the capacitor dielectric layer made of a high dielectric material in terms of film thickness of an oxide film.

From the result in the table 1, it can be seen that the characteristic teq was improved with time of oxygen plasma processing. With the same characteristics teq, a longer time of the oxygen plasma processing enabled increase in thickness of the capacitor dielectric layer, and thereby could reduce leak at the capacitor to a higher extent. If the time of oxygen plasma processing was 3 minutes or longer, the characteristics teq were significantly improved. Therefore, it was found that the overashing of 200–300% was required for achieving an effect of reducing the leak current by introducing oxygen into the electrode.

According to this embodiment, since oxygen can be introduced into the lower electrode by the ashing processing which is performed for removing the resist pattern, the processes can be simplified.

Embodiment 3

For introducing oxygen into the electrode in another manner, the electrode layer may have a multilayer structure. According to this measure, a first platinum film is formed in 100% argon before sputtering of platinum in an oxygen atmosphere, and the first platinum film is used as an oxygen diffusion barrier having an anti-oxidation property during sputtering for the second platinum film. More specifically, the platinum film used as the lower electrode is formed of the multilayer structure for suppressing oxidation of the underlying layer and, more specifically, is formed of the layer at the first level, which is formed in the atmosphere of 100% argon, and the film at the second level, which is formed under the conditions of the oxygen partial pressure $(O_2/(Ar+O_2))$ in a range from $1\times10^{-5}$ to 0.1. The structure employing the above measure will be described below.

Figure 18:
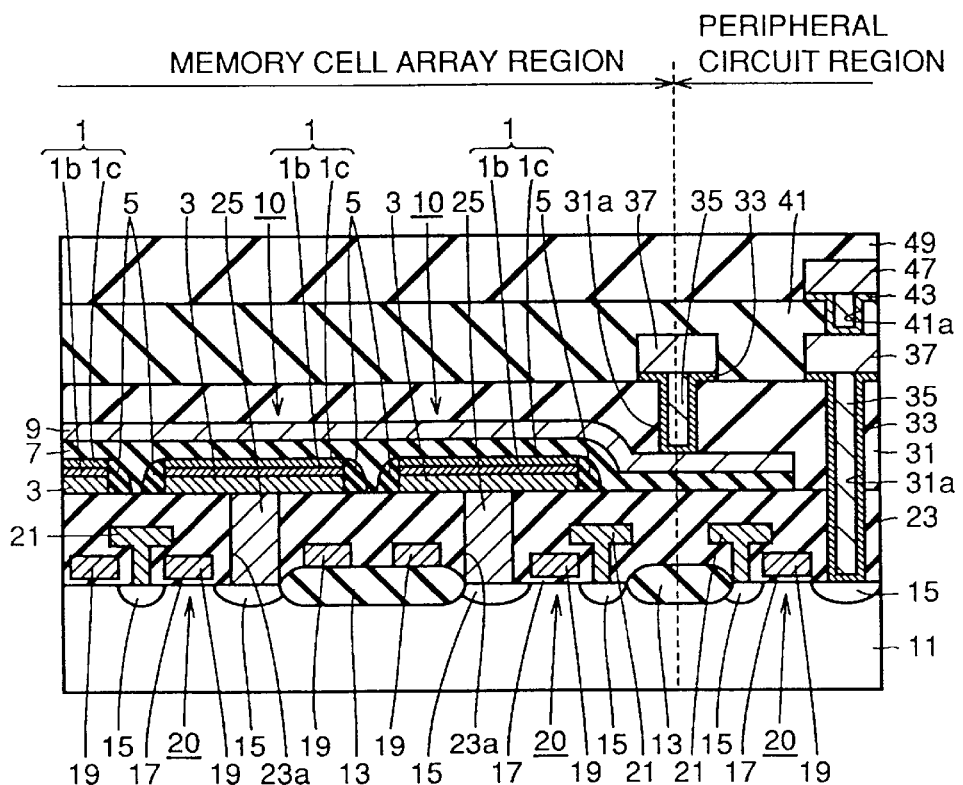
FIG. 18 is a cross section schematically showing a structure of a semiconductor device having a capacitor of an embodiment 3 of the invention.

Referring to FIG. 18, lower electrode layer 1 in this embodiment has at least a two-layer structure formed of, e.g., a first platinum film 1b and a second platinum film 1c containing oxygen introduced thereinto. The concentration of oxygen introduced into second platinum film 1c is uniform throughout the film, and is in a range from 0.01 wt % to 5 wt %.

Structures other than the above are the substantially same as those of the embodiment 1 shown in FIG. 1. The same parts and portions bear the same reference numbers, and will not be described below.

A manufacturing method of this embodiment will now be described below.

Figure 19:
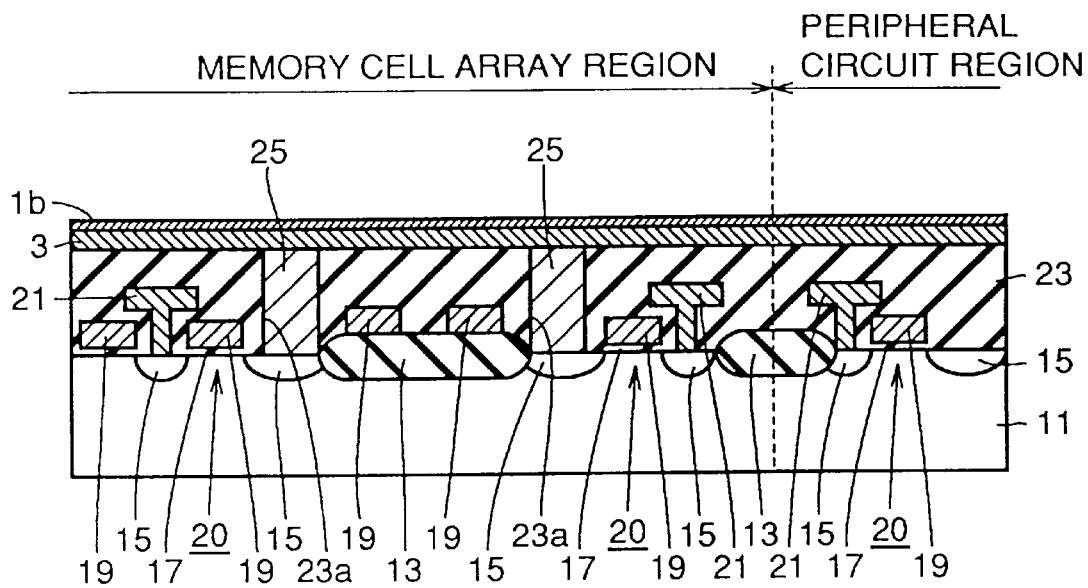
FIGS. 19 and 20 are schematic cross sections showing, in accordance with the order of steps, a method of manufacturing the semiconductor device having the capacitor of the embodiment 3 of the invention.

The manufacturing method of this embodiment is first performed through the same step as that of the embodiment 1 shown in FIG. 2. Then, as shown in FIG. 19, an anti-diffusion film, which is be arranged between plug layer 25 and the lower electrode layer and, more specifically, is TiN/Ti multilayer film 3 of 20–100 nm in thickness is formed by the DC sputtering method targeted at Ti. Subsequently, first platinum film 1b of 30–100 nm in thickness is formed on TiN/Ti multilayer film 3 by the RF magnetron sputtering method targeted at platinum under the conditions of 200–600° C., Ar 0.1–1.2 Pa and 1 kW. Sputtering power in the platinum film forming condition is not limited to 1 kW and it may be in a range of 0.3 to 10 kW.

Figure 20:
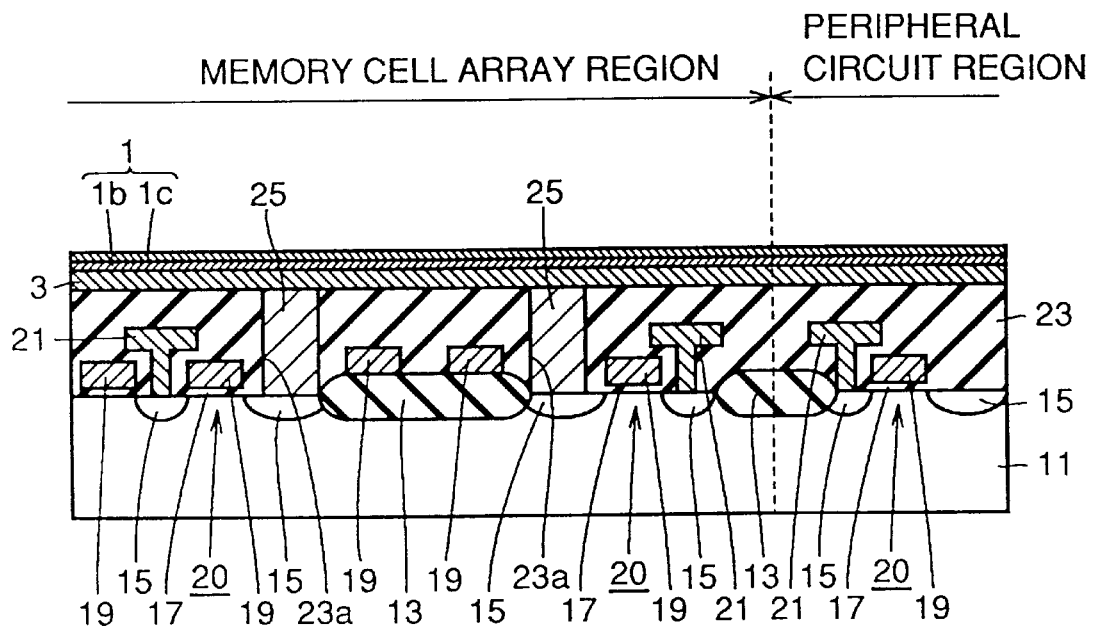

Referring to FIG. 20, second platinum film 1c having a thickness of 30–100 nm and containing oxygen introduced thereinto is formed on first platinum film 1b by the RF magnetron sputtering method targeted at platinum under the conditions of 200–600° C., 0.1–1.2 Pa, $O_2/(Ar+O_2)=1\times10^{-5}$–0.1, and 1 kW. Sputtering power in the platinum film forming condition is not limited to 1 kW and it may be in a range of 0.3 to 10 kW.

Thereafter, steps similar to those of the embodiment 1 shown in FIGS. 4 to 9 are performed so that the structure of the DRAM shown in FIG. 15 is completed.

The inventors and others conducted the following experiment for determining the roughening of the surface of lower electrode layer 1 which had the multilayer structure as shown in FIG. 18. The first platinum film was formed on the barrier metal layer made of TiN under the conditions that the wafer heating temperature was 400° C., the flow rate of Ar was 40 sccm, the pressure was 0.19 Pa and the output was 1 kW. Then, the second platinum film was formed on the first platinum film under the conditions that the wafer heating temperature was 400° C., the flow ratio of $Ar/O_2$ was 38/2, the pressure was 0.19 Pa and the output was 1 kW. An SEM image shown in FIG. 21 was obtained by observing the upper surface of the second platinum film thus formed.

Figure 21:
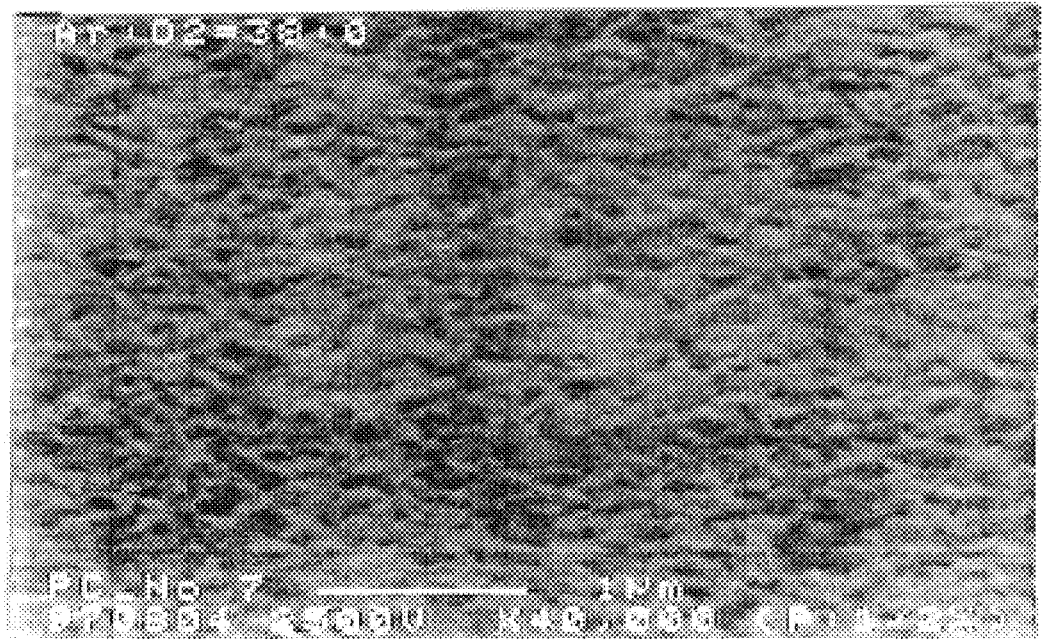
FIG. 21 is an SEM photograph showing an upper surface of a platinum film of a multilayer structure formed by the method of the embodiment 3 of the invention.

As can be seen from FIG. 21, expansion due to oxidation of the underlying layer did not occur at the surface of the second platinum film. This was because the platinum film had the multilayer structure, and the first platinum film served as the oxygen diffusion barrier against oxidation of the barrier metal layer during sputtering for the second platinum film.

According to this embodiment, as described above, lower electrode layer 1 has the multilayer structure formed of first and second platinum films 1b and 1c, so that expansion of underlying barrier metal layer 3 can be prevented even when the sputtering is performed for forming second platinum film 1c in the atmosphere containing oxygen. Therefore, it is possible to prevent peeling of the platinum film due to expansion of underlying barrier metal layer 3 as well as current leak which may be cause by concentration of the electric field.

Since lower electrode layer 1 has the multilayer structure, it can be considered that the first platinum film 1b acts as the oxygen diffusion barrier during sputtering for second platinum film 1c so that it is possible to prevent expansion due to oxidation of barrier metal layer 3 even if second platinum film 1c is set to a temperature of 450° C. or higher during the sputtering. As described above, the multilayer structure can extend the range of the sputtering temperature of second platinum film 1c, so that the sputtering conditions can be set easily.

In this embodiment, since oxygen can be introduced into lower electrode layer 1 at the same time as the sputtering for lower electrode layer 1, an independent step for introducing oxygen into lower electrode layer 1 is not necessary so that the manufacturing processes are not complicated.

Figure 22:
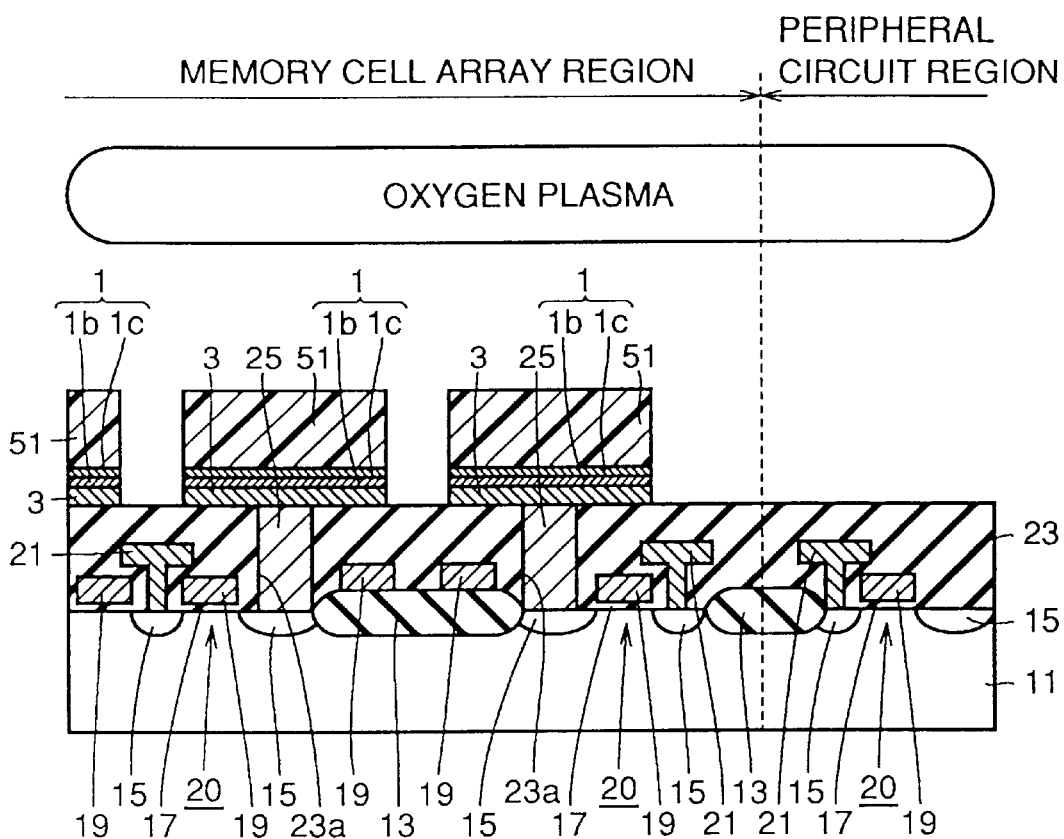
FIGS. 22 and 23 show steps of introducing oxygen into the platinum film by overashing in the embodiment 3 of the invention.
Figure 23:
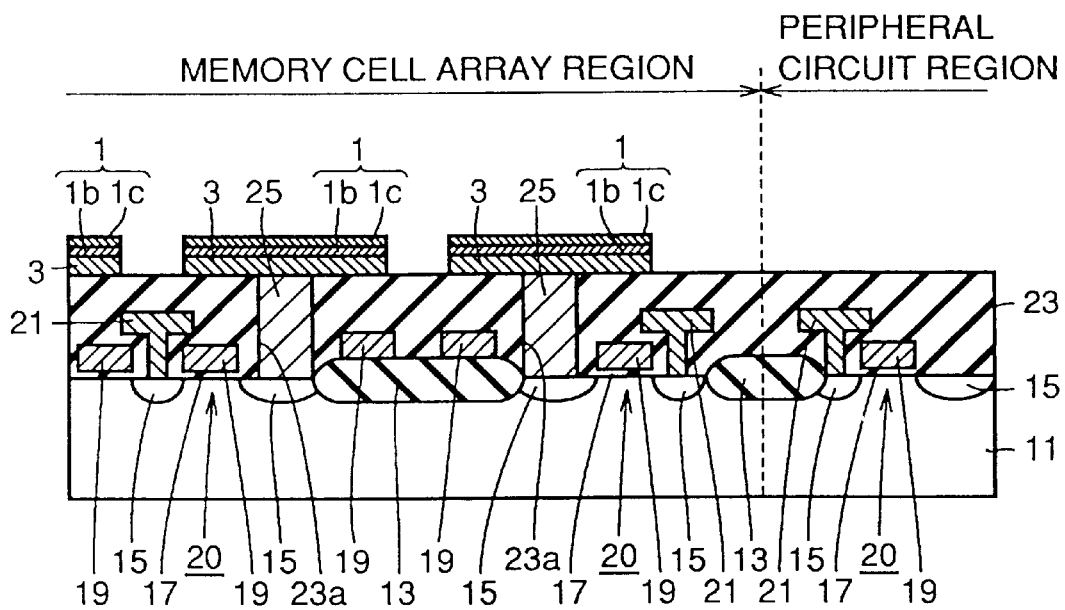

In this embodiment, oxygen is introduced into second platinum film 1c by the sputtering in the atmosphere containing oxygen. However, the method of introducing the oxygen is not restricted to this. For example, as shown in FIGS. 22 and 23, oxygen may be introduced into second platinum film 1c by performing overashing when patterning platinum films 1b and 1c with resist pattern 51 after barrier metal layer 3, first platinum film 1b and second platinum film 1c are successively layered.

Figure 24:
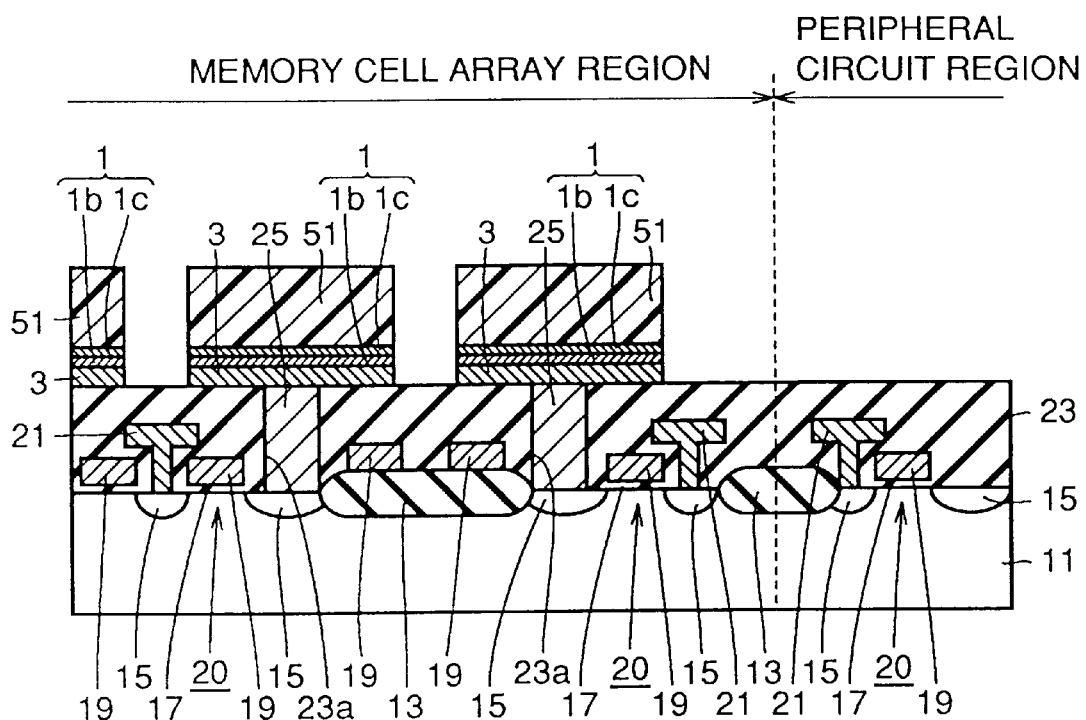
FIGS. 24 and 25 show steps of introducing oxygen into the platinum film by ion implantation in the embodiment 3 of the invention.
Figure 25:
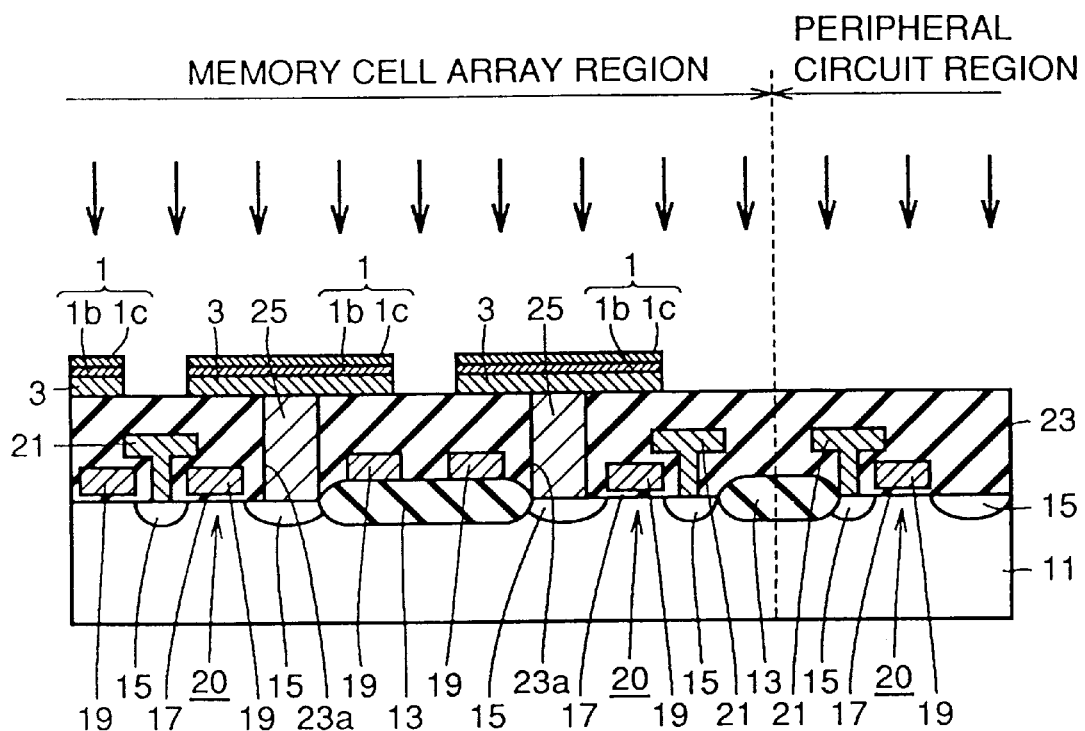
Figure 26:
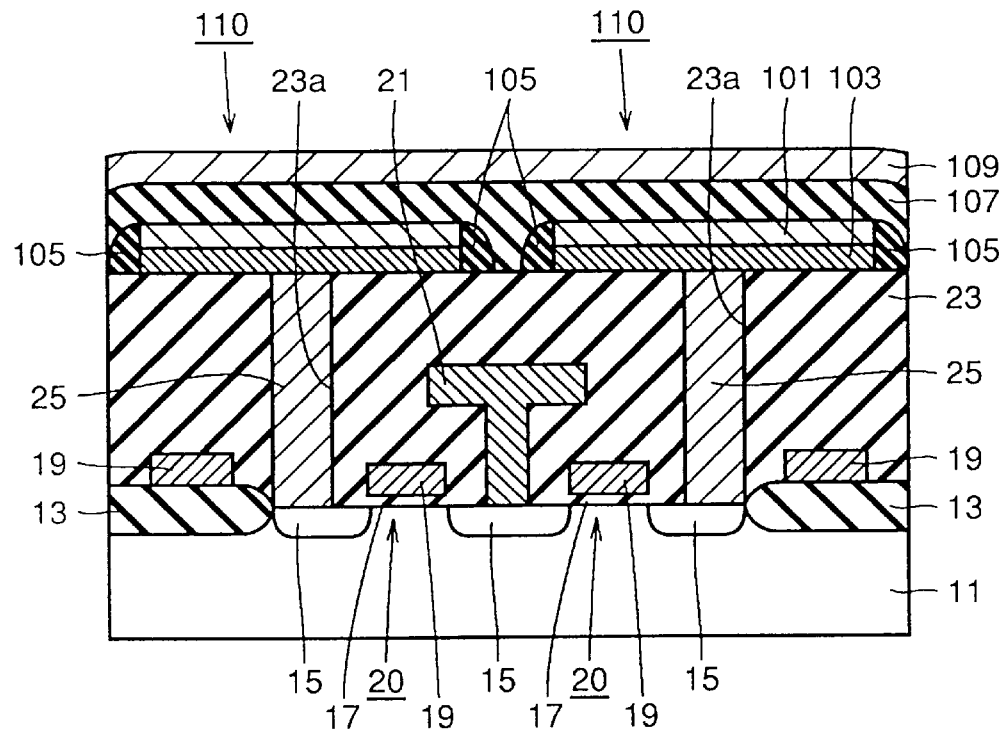
FIG. 26 is a cross section schematically showing a structure of a semiconductor device having a capacitor in the prior art.

Alternatively, as shown in FIGS. 24 and 25, introduction of oxygen may be performed by ion-implanting oxygen ions into first platinum film 1b after patterning first and second platinum films 1b and 1c with resist pattern 51.

In this case, however, ions are physically introduced into second platinum film 1c so that the crystallinity at the surface of second platinum film 1c is disturbed. Therefore, it is necessary to take into consideration the fact that crystallinity of capacitor dielectric layer 7 formed thereon is disturbed.

In the embodiments 1 and 3, the oxygen pressure (PO, Unit: Pa) during the sputtering for lower electrode layer 1 and second platinum film 1c is required only to satisfy the following relationship:

$$P_0 \leq 0.0073 - 2.66/T$$

where T represents the wafer heating temperature (K) during the sputtering, and this formula was derived from practical experience.

The embodiments 1 to 3 have been described in connection with the structures in which platinum is used for lower and upper electrode layers 1 and 9. However, the material is not restricted to this, and the lower and upper electrodes 1 and 9 may be made of iridium, rhodium, ruthenium, palladium, osmium or alloy of them.

Also, description has been made principally on the structure that the high dielectric material contained in the capacitor dielectric layer is BST. However, the material is not restricted to BST, but may be selected from a group including tantalum pentoxide, PLZT, SBT, PZT, STO and BTO.

The embodiments 1 to 3 have been described in connection with the method in which plug layer 25 is made of doped polycrystalline silicon. However, plug layer 25 may be made of the same material as that of barrier metal layer 3. In this case, barrier metal layer 3 is not required, and lower electrode layer 1 may be in direct contact with plug layer 25.

The embodiments 1 to 3 have been described in connection with the method in which the atmosphere for the platinum sputtering contains oxygen. However, a similar effect can be achieved with an oxidizing gas such as $O_3$, $N_2O$, NO, $NO_2$ or $H_2O$ other than $O_2$.

In the embodiment 2, oxygen plasma is used for the overashing. However, a similar effect can be achieved with plasma of an oxidizing gas such as $O_3$, $N_2O$, NO, $NO_2$ or $H_2O$, a gas mixture of these gases, or a gas mixture of such an oxidizing gas and an inert gas.

Although the embodiments 1 to 3 have been described in connection with the memory cell structure of the DRAM, the invention is not restricted to this, and can be applied to various semiconductor devices provided with capacitors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a capacitor comprising:

a capacitor dielectric layer containing a high dielectric material; and first and second electrode layers sandwiching said capacitor dielectric layer, at least one of said first and second electrode layers including:

a first metal layer; and a second metal layer located in contact with said capacitor dielectric layer between said capacitor dielectric layer and said first metal layer and containing 0.01 wt. % to 5 wt. % oxygen.

2. The semiconductor device having the capacitor according to claim 1, wherein at least one of said first and second metal layers includes at least one kind of material selected from a group containing platinum, iridium, rhodium, ruthenium, palladium and osmium.

3. The semiconductor device having the capacitor according to claim 2, wherein said high dielectric material includes at least one kind of material selected from a group containing tantalum pentoxide, barium strontium titanate, lead lanthanum zirconate titanate, strontium bismuthate tantalate, lead zirconate titanate, strontium titanate and barium titanate.

4. The semiconductor device having the capacitor according to claim 1, further comprising:

a semiconductor substrate having a main surface;

a conductive region formed at said main surface;

an insulating layer formed on said conductive region and having a hole reaching a portion of said conductive region; and a barrier metal layer positioned between said first electrode layer and said conductive region electrically connected through said hole, wherein said first electrode layer has at least a portion formed on said barrier metal layer, said second electrode layer is formed on said first electrode layer with said capacitor dielectric layer therebetween, and said first electrode layer has said first and second metal layers.

* * * * *

UNITED STATES PATENT AND TRADEMARK OFFICE
CERTIFICATE OF CORRECTION

PATENT NO. : 6,078,072
DATED : June 20, 2000
INVENTOR(S) : Tomonori OKUDAIRA, et al.

It is certified that error appears in the above-identified patent and that said Letters Patent is hereby corrected as shown below:

In the Claims:

Column 16, Claim 2, Line 37, before "platinum, iridium" delete "containing" and insert --consisting of--.

Claim 3, Line 42, before "tantalum" delete "containing" and insert --consisting of--.

Signed and Sealed this

Eighth Day of May, 2001

*Attest:*

NICHOLAS P. GODICI

*Attesting Officer*  Acting Director of the United States Patent and Trademark Office